(12) United States Patent
Jung et al.

(10) Patent No.: US 8,268,694 B2
(45) Date of Patent: Sep. 18, 2012

(54) METHOD OF MANUFACTURING A TRANSISTOR AND METHOD OF MANUFACTURING A SEMICONDUCTOR DEVICE

(75) Inventors: Hyuck-Chai Jung, Suwon-si (KR); Jun-Hee Lim, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 270 days.

(21) Appl. No.: 12/578,291

(22) Filed: Oct. 13, 2009

(65) Prior Publication Data

US 2010/0093141 A1    Apr. 15, 2010

(30) Foreign Application Priority Data

Oct. 13, 2008 (KR) .................. 10-2008-0099930

(51) Int. Cl.
*H01L 21/336* (2006.01)

(52) U.S. Cl. ......... 438/303; 257/E21.634; 257/E21.646; 438/301

(58) Field of Classification Search .................. 438/300, 438/491, 303, 301; 257/E21.401, E21.646, 257/E21.634

See application file for complete search history.

(56) References Cited

U.S. PATENT DOCUMENTS

| 7,115,949 | B2 | 10/2006 | Hoefler et al. | |
|---|---|---|---|---|
| 2004/0063313 | A1* | 4/2004 | Shiratake et al. | 438/672 |
| 2006/0033166 | A1* | 2/2006 | Park et al. | 257/368 |
| 2006/0237766 | A1* | 10/2006 | Ahn | 257/314 |

FOREIGN PATENT DOCUMENTS

| KR | 10-0637690 | 10/2006 |
|---|---|---|
| KR | 10-0703984 | 3/2007 |

* cited by examiner

*Primary Examiner* — Caridad Everhart
(74) *Attorney, Agent, or Firm* — F. Chau & Associates, LLC

(57) ABSTRACT

In a method of manufacturing a transistor, a gate structure is formed on a substrate. First impurities are implanted into the substrate to form an impurity region at an upper portion of the substrate adjacent to the gate structure. An epitaxial layer is formed on the impurity region. An insulation layer having an opening partially exposing the epitaxial layer is formed on the substrate. Second impurities are implanted into a portion of the epitaxial layer exposed by the opening.

9 Claims, 23 Drawing Sheets

METHOD OF MANUFACTURING A TRANSISTOR AND METHOD OF MANUFACTURING A SEMICONDUCTOR DEVICE

CROSS-REFERENCE TO RELATED APPLICATION

This application claims priority under 35 USC §119 to Korean Patent Application No. 2008-99930, filed on Oct. 13, 2008 in the Korean Intellectual Property Office (KIPO), the contents of which are herein incorporated by reference in their entirety.

BACKGROUND

1. Field

Example embodiments relate to a transistor, a method of manufacturing the same, a semiconductor device and a method of manufacturing the same. More particularly, example embodiments relate to a transistor having an elevated source/drain (ESD) layer, a method of manufacturing the same, a semiconductor device having an ESD layer and a method of manufacturing the same.

2. Discussion of the Related Art

A transistor may include a gate structure on a substrate and a source/drain region adjacent to the gate structure at an upper portion of the substrate. The source/drain region may be formed by doping impurities onto the substrate, and the characteristics of the transistor may be changed according to those of the source/drain region.

SUMMARY

Example embodiments provide a transistor having good electrical characteristics, a method of manufacturing the transistor, a semiconductor device having good electrical characteristics, and a method of manufacturing the semiconductor device.

According to example embodiments, there is provided a method of manufacturing a transistor. In the method, a gate structure is formed on a substrate. First impurities are implanted into the substrate to form an impurity region at an upper portion of the substrate adjacent to the gate structure. An epitaxial layer is formed on the impurity region. An insulation layer having an opening partially exposing the epitaxial layer is formed on the substrate. Second impurities are implanted into a portion of the epitaxial layer exposed by the opening.

In an example embodiment, some of the second impurities may be diffused into the impurity region.

In an example embodiment, the opening may expose a portion of the epitaxial layer spaced apart from the gate structure. The opening may expose a portion of the epitaxial layer having a surface substantially parallel to an upper surface of the substrate.

According to example embodiments, there is provided a method of manufacturing a semiconductor device. In the method, a first gate structure and a second gate structure are formed in a peripheral region and a cell region of a substrate, respectively. First impurities are implanted into the substrate to form an impurity region at an upper portion of the peripheral region of the substrate adjacent to the first gate structure. A first epitaxial layer is formed on a portion of the peripheral region not covered by the first gate structure and a second epitaxial layer on a portion of the cell region not covered by the second gate structure. An insulation layer having an opening partially exposing the first epitaxial layer is formed on the substrate. Second impurities are implanted into a portion of the first epitaxial layer exposed by the opening.

In an example embodiment, some of the second impurities may be diffused into the impurity region.

In an example embodiment, the opening may expose a portion of the first epitaxial layer spaced apart from the first gate structure.

In an example embodiment, when the second gate structure is formed, a trench may be formed in the cell region, and at least part of the second gate structure may be formed in the trench.

In an example embodiment, prior to forming the trench, third impurities may be further implanted into the cell region.

In an example embodiment, when the second gate structure is formed, a gate insulation layer may be formed, a gate conductive layer may be formed on the gate insulation layer, and a gate mask layer may be formed on the gate conductive layer. The gate mask layer, the gate conductive layer and the gate insulation layer may be patterned to form a gate mask, a gate electrode and a gate insulation layer pattern, respectively, in the trench. A spacer may be formed on a sidewall of the gate mask and the gate electrode to fill the remaining unfilled portion of the trench.

According to example embodiments, there is provided a method of manufacturing a semiconductor device. In the method, a first gate structure and a second gate structure are formed in a peripheral region and a cell region of a substrate, respectively. First impurities are implanted into the substrate to form an impurity region at an upper portion of the peripheral region of the substrate adjacent to the first gate structure. A first epitaxial layer is formed on a portion of the peripheral region not covered by the first gate structure, and a second epitaxial layer is formed on a portion of the cell region not covered by the second gate structure. An insulation layer having an opening partially exposing the first epitaxial layer is formed on the substrate. Second impurities are implanted into a portion of the first epitaxial layer exposed by the opening. A capacitor is formed to be electrically connected to a portion of the second epitaxial layer.

In an example embodiment, the opening may expose a portion of the first epitaxial layer spaced apart from the first gate structure.

In an example embodiment, a first plug filling the opening may be formed, and a second plug connecting the portion of the second epitaxial layer to the capacitor may be formed.

In an example embodiment, the first plug may be formed using a metal, and the second plug may be formed using polysilicon doped with third impurities.

In an example embodiment, some of the third impurities may be diffused into the second epitaxial layer.

According to example embodiments, there is provided a method of manufacturing a semiconductor device. In the method, a first gate structure and a plurality of second gate structures are formed in a peripheral region and a cell region of a substrate, respectively. First impurities are implanted into the substrate to form an impurity region at an upper portion of the peripheral region of the substrate adjacent to the first gate structure. A first epitaxial layer is formed on a portion of the peripheral region not covered by the first gate structure, and a second epitaxial layer is formed on a portion of the cell region not covered by the second gate structures. A common source line (CSL) connected to a first portion of the second epitaxial layer is formed. An insulation layer having an opening partially exposing the first epitaxial layer is formed on the substrate. Second impurities are implanted into a portion of the first epitaxial layer exposed by the opening. A bit line electrically connected to a second portion of the second epitaxial layer is formed.

In an example embodiment, the opening may expose a portion of the first epitaxial layer spaced apart from the first gate structure.

In an example embodiment, a first plug filling the opening may be formed, and a second plug connecting the second portion of the second epitaxial layer to the bit line may be formed.

According to example embodiments, there is provided a transistor. The transistor includes a gate structure, an impurity region and an epitaxial layer. The gate structure is formed on a substrate. The impurity region doped with first impurities is formed at an upper portion of the substrate adjacent to the gate structure. The epitaxial layer is formed on the impurity region adjacent to the gate structure. A portion of the epitaxial layer spaced apart from the gate structure is doped with second impurities.

In an example embodiment, the impurity region may further include the second impurities.

According to example embodiments, there is provided a semiconductor device. The semiconductor device includes a first gate structure, a second gate structure, an impurity region, a first epitaxial layer and a second epitaxial layer. The first gate structure is formed in a peripheral region of a substrate. The second gate structure is formed in a cell region of the substrate. The impurity region doped with first impurities is formed at an upper portion of the peripheral region of the substrate adjacent to the first gate structure. The first epitaxial layer is formed on the impurity region adjacent to the first gate structure. A portion of the first epitaxial layer spaced apart from the first gate structure is doped with second impurities. The second epitaxial layer doped with third impurities is formed on a portion of the cell region not covered by the second gate structure.

In an example embodiment, the impurity region may further include the second impurities.

In an example embodiment, the semiconductor device may further include a trench in the cell region, and at least part of the second gate structure may be formed in the trench.

According to example embodiments, there is provided a semiconductor device. The semiconductor device includes a first gate structure, a second gate structure, a first impurity region, a first epitaxial layer, a second epitaxial layer and a capacitor. The first gate structure is formed in a peripheral region of a substrate. The second gate structure is formed in a cell region of the substrate. The first impurity region doped with first impurities is formed at an upper portion of the peripheral region of the substrate adjacent to the first gate structure. The first epitaxial layer including a second impurity region doped with second impurities is formed on the first impurity region adjacent to the first gate structure. The second impurity region is spaced apart from the first gate structure. The second epitaxial layer doped with third impurities is formed on a portion of the cell region not covered by the second gate structure. The capacitor is formed to be electrically connected to a portion of the second epitaxial layer.

In an example embodiment, the semiconductor device may further include a first plug on the second impurity region, and a second plug connecting the portion of the second epitaxial layer to the capacitor.

According to example embodiments, there is provided a semiconductor device. The semiconductor device includes a first gate structure, a plurality of second gate structures, a first impurity region, a first epitaxial layer, a second epitaxial layer, a common source line (CSL), and a bit line. The first gate structure is formed in a peripheral region of a substrate. The second gate structures are formed in a cell region of the substrate. The first impurity region doped with first impurities is formed at an upper portion of the peripheral region of the substrate adjacent to the first gate structure. The first epitaxial layer including a second impurity region doped with second impurities is formed on the first impurity region adjacent to the first gate structure. The second impurity region is spaced apart from the first gate structure. The second epitaxial layer doped with third impurities is formed on a portion of the cell region not covered by the second gate structure. The CSL is formed to be connected to a first portion of the second epitaxial layer. The bit line is formed to be electrically connected to a second portion of the second epitaxial layer.

In an example embodiment, the semiconductor device may further include a first plug on the second impurity region, and a second plug connecting the second portion of the second epitaxial layer to the bit line.

In an example embodiment, each of the second gate structures may include a tunnel insulation layer pattern, a floating gate, a dielectric layer pattern and a control gate.

In an example embodiment, each of the second gate structures may include a tunnel insulation layer pattern, a charge storing layer pattern, a blocking layer pattern and a gate electrode.

According to example embodiments, before forming an epitaxial layer, an impurity region may be formed at a portion of a substrate by implanting impurities. Additionally, after forming the epitaxial layer, impurities may be implanted into the substrate only through a portion of the epitaxial layer at which no facet phenomenon occurs, thereby forming an ESD layer. Thus, a doping profile of the impurity region may be uniformly formed because the facet does not affect the doping profile. Furthermore, when the epitaxial layer is not uniform, the impurity region may have a uniform doping profile by reducing an area through which the impurities are implanted.

Accordingly, the transistor or the semiconductor device in accordance with example embodiments may have a uniform doping profile and more uniform characteristics regardless of the shape or the thickness of the epitaxial layer.

BRIEF DESCRIPTION OF THE DRAWINGS

Example embodiments will be more clearly understood from the following detailed description taken in conjunction with the accompanying drawings.

DETAILED DESCRIPTION OF THE EMBODIMENTS

Figure 1:
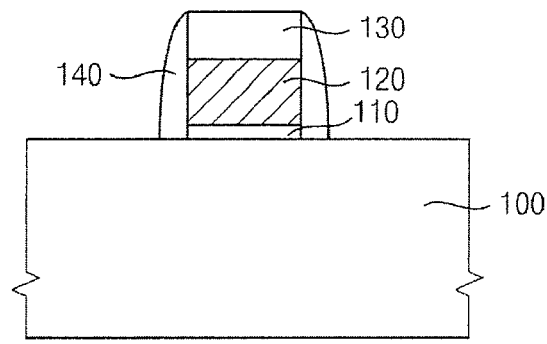
FIGS. 1 to 5 are cross-sectional views illustrating a method of manufacturing a transistor in accordance with example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numerals may refer to like elements throughout.

FIGS. 1 to 5 are cross-sectional views illustrating a method of manufacturing a transistor in accordance with example embodiments.

Referring to FIG. 1, a gate structure may be formed on a substrate 100. The substrate 100 may include a semiconductor substrate such as a silicon substrate, a germanium substrate, a silicon-germanium substrate, a silicon-on-insulator (SOI) substrate, a germanium-on-insulator (GOI) substrate, etc. The substrate 100 may further have a well region (not shown) including p-type impurities or n-type impurities.

The gate structure may be formed by forming a gate insulation layer, a gate conductive layer and a gate mask layer on the substrate 100 and patterning the gate mask layer, the gate conductive layer, and the gate insulation layer. As a result, the gate structure has a gate insulation layer pattern 110, a gate electrode 120 and a gate mask 130 sequentially stacked on the substrate 100.

Particularly, the gate insulation layer may be formed using an oxide such as silicon oxide and an oxynitride such as silicon oxynitride. The gate insulation layer may be formed by thermally oxidizing the substrate 100 or by performing a chemical vapor deposition (CVD) process. The gate conductive layer may be formed using doped polysilicon, a metal, a metal nitride and/or a metal silicide. The gate mask layer may be formed using silicon nitride or silicon oxynitride. The gate conductive layer and the gate mask layer may be formed by a CVD process, a physical vapor deposition (PVD) process, an atomic layer deposition (ALD) process, etc.

The gate structure further includes a spacer 140 on sidewalls of the gate mask 130, the gate electrode 120 and the gate insulation layer pattern 110. The spacer 140 may be formed by forming a spacer layer on the substrate 100 to cover the gate mask 130, the gate electrode 120 and the gate insulation layer pattern 110, and partially removing the spacer layer. The spacer layer may be partially removed by an anisotropic etching process. The spacer layer may be formed using a nitride such as silicon nitride.

Figure 2:
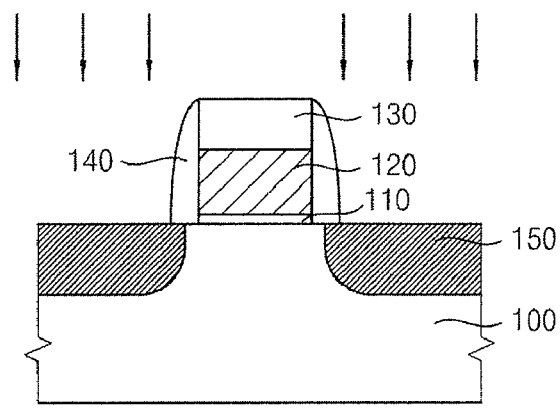

Referring to FIG. 2, first impurities are implanted into the substrate 100 to form an impurity region 150. The impurity region 150 may be fanned by an ion implantation process using the gate structure as a mask, and thus the impurity region 150 may be formed at an upper portion of the substrate 100 adjacent to the gate structure. The first impurities may include p-type impurities such as boron, gallium, etc., or n-type impurities such as phosphorus, arsenic, etc.

Figure 3:
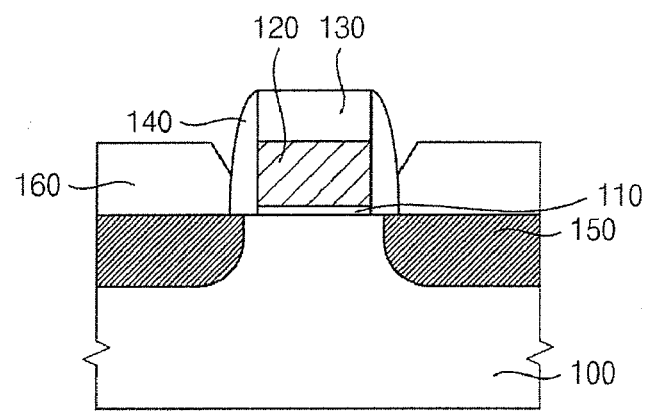

Referring to FIG. 3, a selective epitaxial growth (SEG) method may be performed on the substrate 100 to form an epitaxial layer 160. The epitaxial layer 160 may be formed using a portion of the impurity region 150 that is not covered by the gate structure as a seed layer.

In an example embodiment, the SEG method may be performed by a CVD process at a temperature of about 700° C. to about 900° C. under a pressure of about 10 torr to about 50 torr. The CVD process may be performed using dichlorosilane gas, or dichlorosilane gas and germane gas, and thus a single crystalline silicon layer or a single crystalline silicon-germanium layer may be formed. Alternatively, the SEG method may be performed by a reduced pressure chemical vapor deposition (RPCVD) process, an ultra high vacuum chemical vapor deposition (UHVCVD) process, a metal organic chemical vapor deposition (MOCVD) process, etc.

When the epitaxial layer 160 is formed, a facet phenomenon may occur at a portion of the epitaxial layer 160 adjacent to the gate structure. As a result, the portion of the epitaxial layer 160 adjacent to the gate structure may be formed so that it is not parallel to a top surface of the substrate 100, but, instead, is angled with respect to the top surface of the substrate 100.

Figure 4:
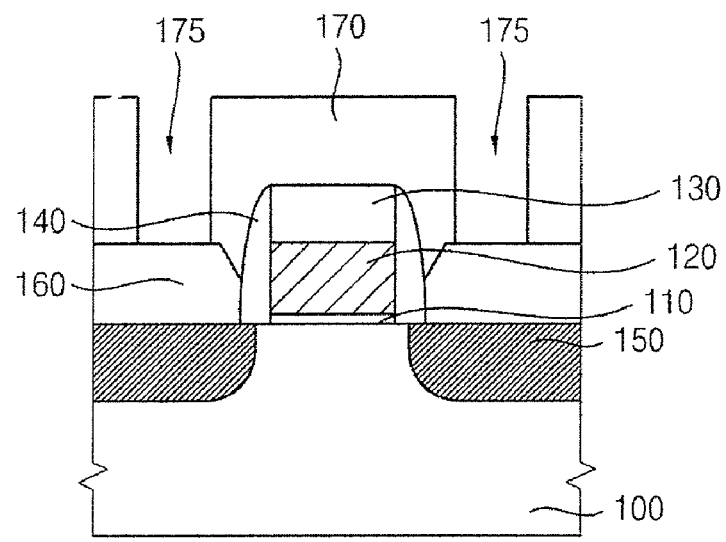

Referring to FIG. 4, an insulating interlayer 170 is formed on the substrate 100 to cover the gate structure and the epitaxial layer 160, and openings 175 may be formed through the insulating interlayer 170 to partially expose the epitaxial layer 160.

The insulating interlayer 170 may be formed by a CVD process, a PVD process, an ALD process, etc., using an oxide, a nitride and/or an oxynitride.

In an example embodiment, the openings 175 expose only a portion of the epitaxial layer 160 where the facet phenomenon does not occur. An area of the exposed portion of the epitaxial layer 160 may be varied. For example, when the epitaxial layer 160 is formed to have a non-uniform thickness, the openings 175 may be formed to expose a relatively small portion of the epitaxial layer 160, so that the exposed portion of the epitaxial layer 160 may have a relatively uniform thickness.

Figure 5:
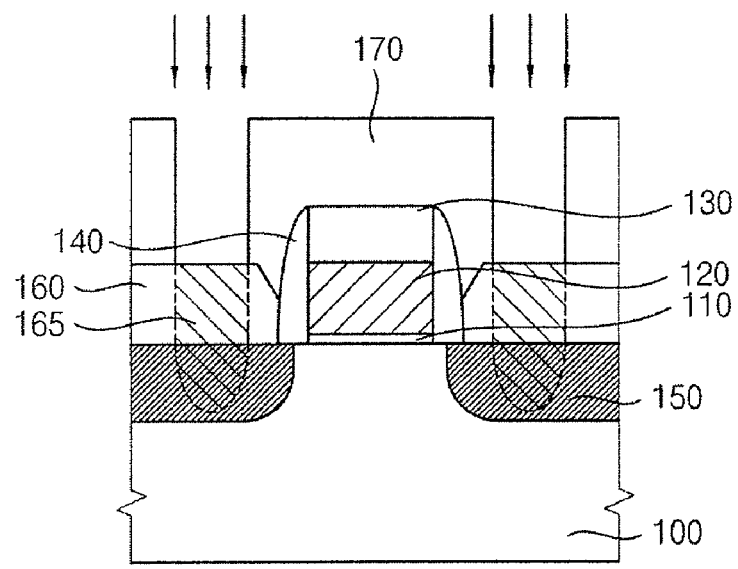

Referring to FIG. 5, an ion implantation process may be performed using the insulating interlayer 170 covering the gate structure as a mask, so that second impurities may be implanted into the exposed portion of the epitaxial layer 160. Thus, a portion of the epitaxial layer 160 into which the second impurities are implanted may serve as an elevated source/drain (ESD) layer 165.

When the ion implantation process is performed, the second impurities may be also implanted into an upper portion of the substrate 100. In an example embodiment, the second impurities may be implanted into the impurity region 150. In another example embodiment, the second impurities may be implanted into another portion of the substrate 100 aside from the impurity region 150.

Alternatively, the second impurities may diffuse into the impurity region 150 or other portions of the substrate 100 in a heat treatment process performed after the ion implantation process.

The second impurities may have a conduction type substantially the same as that of the first impurities. The quantity of the second impurities may be substantially the same as or different from that of the first impurities.

The impurity region 150 in which the first impurities and/or the second impurities are doped may serve as a source/drain region together with the ESD layer 165 in which the second impurities are doped.

The transistor may include the gate structure and the source/drain region, and the source/drain region may include the ESD layer 165 and the impurity region 150. When the second impurities are doped into a portion of the substrate 100 aside from the impurity region 150, the source/drain region may include that portion of the substrate 100 in which the second impurities are doped.

According to an embodiment, the second impurities doped into the ESD layer 165 are not be doped into the entire epitaxial layer 160 but are doped into only the portion of the epitaxial layer 160 in which the facet phenomenon does not occur. Additionally, the second impurities may be doped into the impurity region 150 or diffused into the impurity region 150 in a subsequent heat treatment process. As a result, the doping profile of the impurity region 150 is not affected by the facet of the epitaxial layer 160, and is, therefore, uniformly formed.

When the epitaxial layer 160 does not have a uniform thickness, the impurity region 150 may have a relatively uniform doping profile by reducing the area of the openings 175 exposing the epitaxial layer 160. That is, the second impurities may be implanted not through the entire epitaxial layer 160 but only through the openings 175. As a result, non-uniformity of the doping profile of the impurity region 150 may be minimized even though the epitaxial layer 160 may have a non-uniform thickness.

As a result, in the transistor in accordance with example embodiments, the impurity region 150 may have a uniform doping profile regardless of the shape or the thickness of the epitaxial layer 160. Accordingly, the doping profile of the impurity region 150 may have a small distribution relative to different positions in the impurity region 150.

Figure 6:
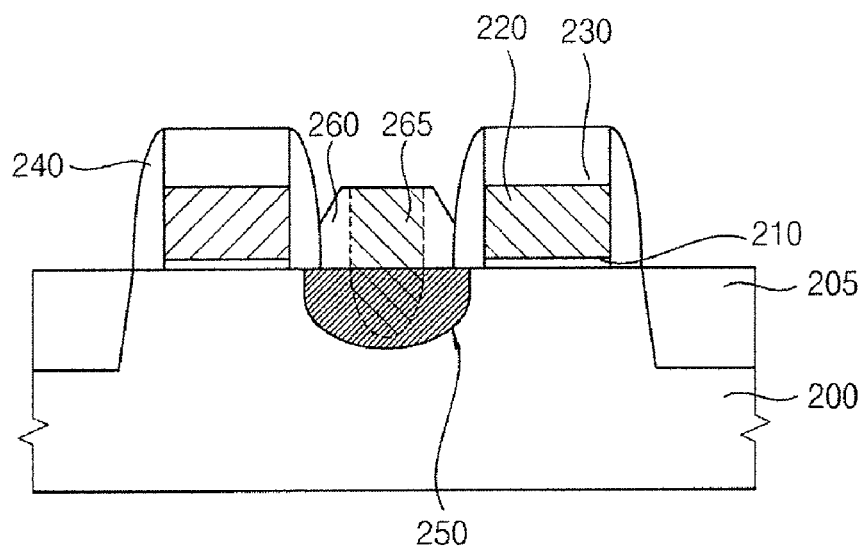
FIG. 6 is a cross-sectional view illustrating a method of manufacturing transistors in accordance with example embodiments.

FIG. 6 is a cross-sectional view illustrating a method of manufacturing transistors in accordance with example embodiments. Each of the transistors illustrated with reference to FIG. 6 is substantially the same or similar to the transistors of FIGS. 1 to 5, except that in FIG. 6, a source/drain region is formed between two transistors.

The transistors are formed on an active region of a substrate 200 that is defined by an isolation layer 205. Each of the transistors has a gate structure including a gate insulation layer pattern 210, a gate electrode 220, a gate mask 230 and a spacer 240. The isolation layer 205 may be formed by a shallow trench isolation (STI) process or a thermal oxidation process. An impurity region 250 in which first impurities and/or second impurities are doped is formed at an upper portion of the substrate 200 adjacent to the gate structures. An epitaxial layer 260 is formed on the impurity region 250. An ESD layer 265 is formed at a portion of the epitaxial layer 260 where no facet phenomenon occurs.

The scope of the inventive concept is not limited to the above transistors, and other adjacent transistors, which have gate structures and source/drain regions therebetween, may be within the scope.

Figure 7:
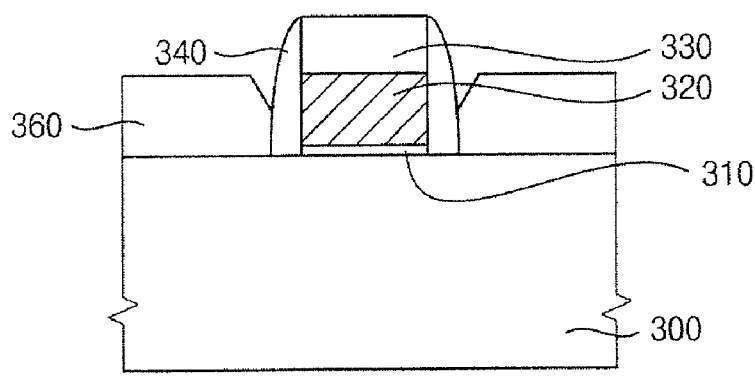
FIGS. 7 to 8 are cross-sectional views illustrating a method of manufacturing a transistor in accordance with a comparative example.
Figure 8:
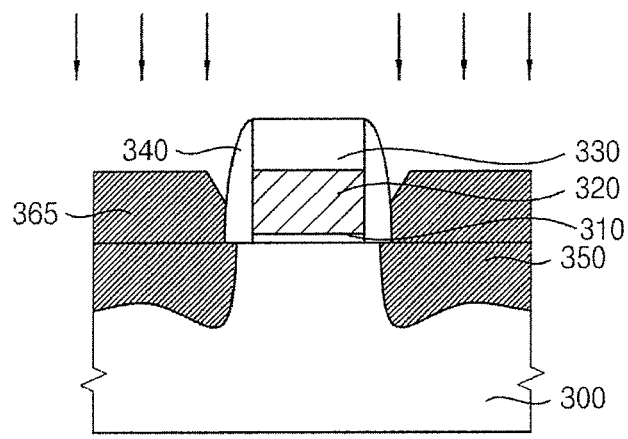

FIGS. 7 to 8 are cross-sectional views illustrating a method of manufacturing a transistor in accordance with a comparative example.

Referring to FIG. 7, a gate structure including a gate insulation layer pattern 310, a gate electrode 320, a gate mask 330 and a spacer 340 may be formed on a substrate 300, and an SEG process may be performed using a portion of the substrate 300 that is not covered by the gate structure as a seed layer to form an epitaxial layer 360. A facet phenomenon may occur at a portion of the epitaxial layer 360 adjacent to the gate structure.

Referring to FIG. 8, an ion implantation process may be performed using the gate structure as a mask to implant impurities into the epitaxial layer 360, thereby forming an ESD layer 365. The impurities may be also implanted into an upper portion of the substrate 300 to form an impurity region 350. The impurity region 350 has a non-uniform doping profile as shown in FIG. 8. The impurities are doped through the entire epitaxial layer 360, so that the impurity region 350 has a deeper depth at a portion over which the facet is formed in the epitaxial layer 360. Additionally, when the epitaxial layer 360 is formed to have a non-uniform thickness, the impurity region 350 has a non-uniform doping profile because the impurities are implanted into the substrate 300 through the entire epitaxial layer 360.

FIGS. 9 to 18 are cross-sectional views illustrating a method of manufacturing a semiconductor device in accordance with example embodiments. Processes illustrated with reference to FIGS. 15 to 18 are substantially the same as or similar to those of FIGS. 2 to 5.

Figure 9:
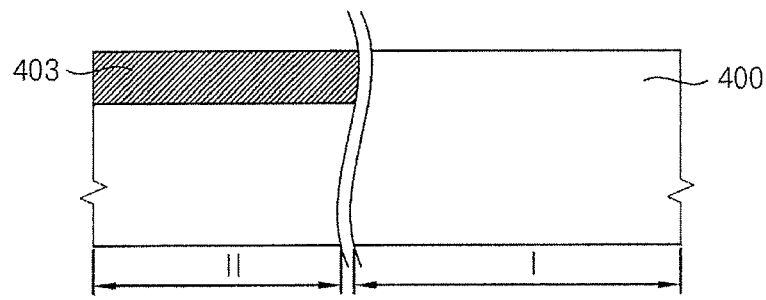
FIGS. 9 to 18 are cross-sectional views illustrating a method of manufacturing a semiconductor device in accordance with example embodiments.

Referring to FIG. 9, a first mask (not shown) is formed on a substrate 400 having a peripheral region I and a cell region II, and an ion implantation process is performed using the first mask as an ion implantation mask. The first mask covers only the peripheral region I, and thus first impurities are doped into the cell region II to form a preliminary source/drain region 403 at an upper portion of the cell region II. The first impurities may include n-type impurities or p-type impurities according to the type of a transistor. The first mask is removed after the ion implantation process.

Figure 10:
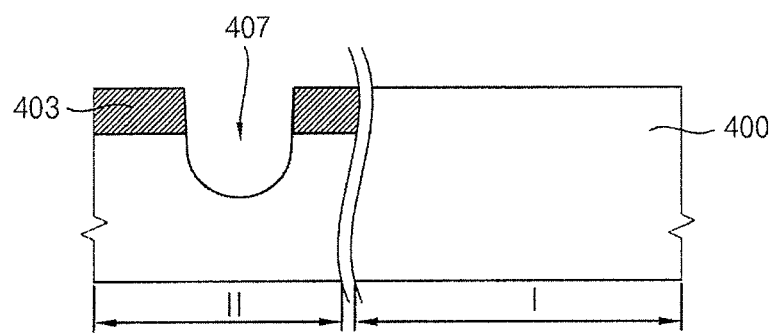

Referring to FIG. 10, a second mask (not shown) may be formed on the substrate 400, and an etching process using the second mask as an etching mask may be performed to partially remove the cell region II of the substrate 400, thereby forming a trench 407. The trench 407 is formed to have a depth deeper than the preliminary source/drain region 403, and thus a sidewall of the preliminary source/drain region 403 is exposed.

In an example embodiment, a reactive ion etching (RIE) process may be performed to partially etch the substrate 400, so that a preliminary trench (not shown) having a vertical sidewall profile may be formed. A dry etching process or a wet etching process may be further performed to enlarge the preliminary trench, thereby forming the trench 407. The dry etching process may include a chemical dry etching (CDE) process using oxygen gas, carbon tetrafluoride gas, etc., and the wet etching process may be performed using SC-1 solution including ammonia, hydrogen peroxide and deionized water.

The second mask may be removed, and an additional heat treatment process may be performed to cure etching damage to the substrate 400 generated in the process for forming the trench 407.

Figure 11:
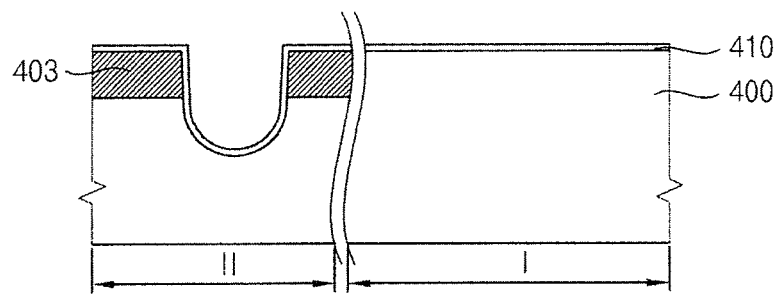

Referring to FIG. 11, a gate insulation layer 410 may be formed on the substrate 400 having the trench 407. In an example embodiment, the gate insulation layer 410 may be formed by performing a thermal oxidation process to deposit silicon oxide on the substrate 400. In another example embodiment, the gate insulation layer 410 may be formed by a CVD process using a high-k material. The high-k material may include hafnium oxide, hafnium silicon oxide, hafnium aluminum oxide, hafnium lanthanum oxide, lanthanum oxide, hafnium silicon oxynitride, hafnium oxynitride, etc.

Figure 12:
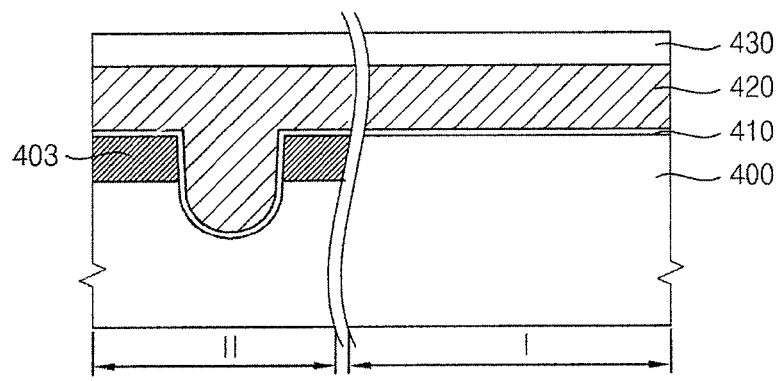

Referring to FIG. 12, a gate conductive layer 420 and a gate mask 430 are sequentially formed on the gate insulation layer 410. The gate conductive layer 420 may be formed using doped polysilicon, a metal, a metal nitride and/or a metal silicide. The gate mask layer 430 may be formed using silicon nitride or silicon oxynitride.

Figure 13:
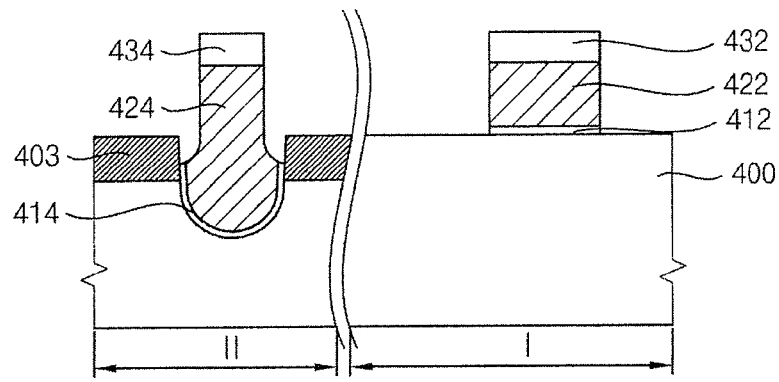

Referring to FIG. 13, the gate mask layer 430 may be patterned using a photoresist (not shown) to form a first gate mask 432 and a second gate mask 434. The gate conductive layer 420 and the gate insulation layer 410 are patterned using the first and second gate masks 432 and 434 as an etching mask to form a first gate insulation layer pattern 412 and a first gate electrode 422 sequentially stacked on the peripheral region I, and a second gate insulation layer pattern 414 and a second gate electrode 424 sequentially stacked on the cell region II. In an example embodiment, the second gate electrode 424 may have a width smaller than that of the trench 407. A reoxidation process for curing etching damage generated during the patterning process may be further performed.

Figure 14:
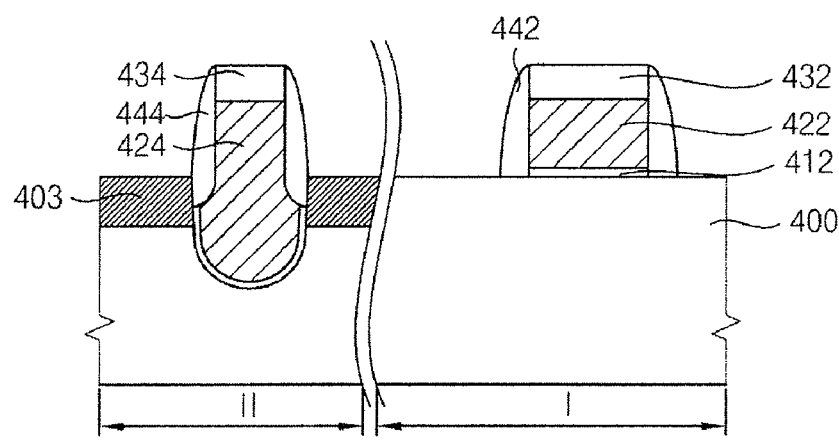

Referring to FIG. 14, a spacer layer may be formed on the substrate 400 to cover the gate masks 432 and 434, the gate electrodes 422 and 424, and the gate insulation layer patterns 412 and 414. The spacer layer is partially removed by an anisotropic etching process to form a first spacer 442 and a second spacer 444. The spacer layer may be formed using a nitride such as silicon nitride. In an example embodiment, the second spacer 444 fills the remaining portion of the trench 407.

Thus, a first gate structure including the first gate insulation layer pattern 412, the first gate electrode 422, the first gate mask 432 and the first spacer 442, and a second gate structure including the second gate insulation layer pattern 414, the second gate electrode 424, the second gate mask 434 and the second spacer 444 are formed in the peripheral region I and the cell region II, respectively.

Figure 15:
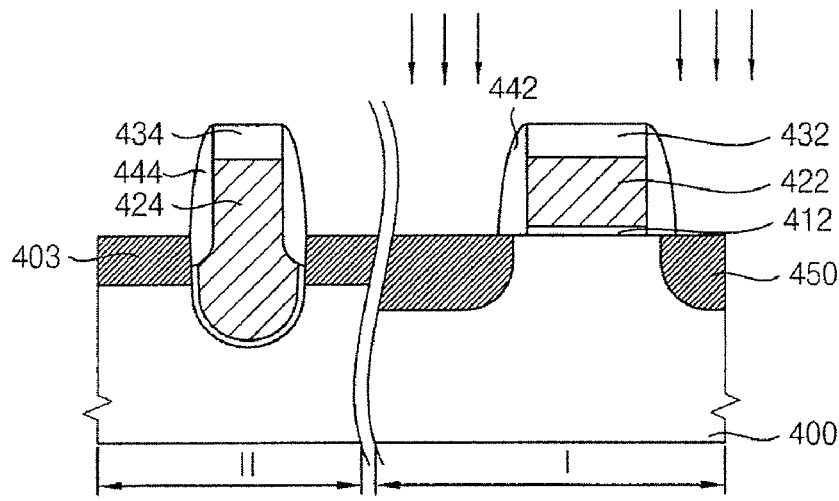

Referring to FIG. 15, second impurities are implanted into the peripheral region I of the substrate 400 adjacent to the first gate structure to form an impurity region 450.

Particularly, after forming a fourth mask (not shown) covering the cell region II of the substrate 400, an ion implantation process may be performed using the first gate structure and the fourth mask as an ion implantation mask to form the impurity region 450. Thus, the impurity region 450 is formed at an upper portion of the peripheral region I adjacent to the first gate structure.

Figure 16:
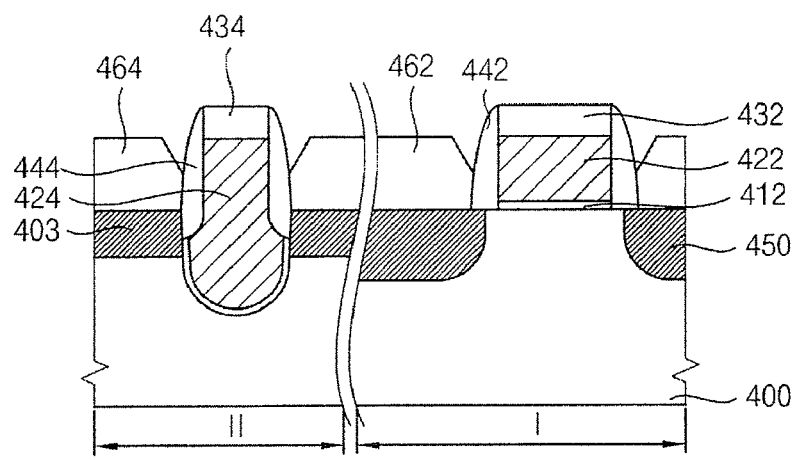

Referring to FIG. 16, after removing the fourth mask, an SEG process may be performed on the substrate 400 to form a first epitaxial layer 462 and a second epitaxial layer 464 on the peripheral region I and the cell region II, respectively. The first and second epitaxial layers 462 and 464 may be formed using portions of the impurity region 450 and the preliminary source/drain region 403 that are not covered by the first and second gate structures as a seed layer, respectively.

Figure 17:
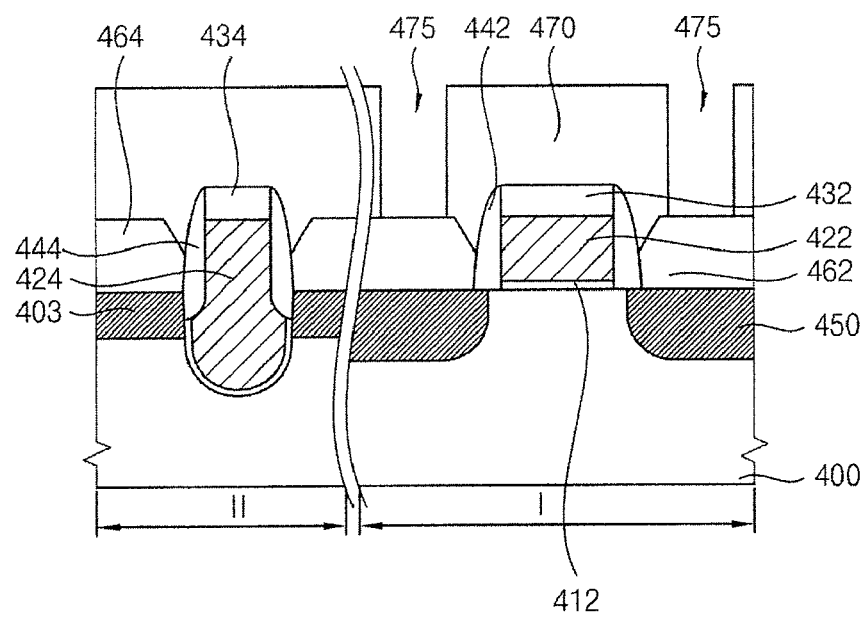

Referring to FIG. 17, an insulating interlayer 470 is formed on the substrate 400 to cover the first and second gate structures and the first and second epitaxial layers 462 and 464, and first openings 475 are formed to partially expose the first epitaxial layer 462. The first openings 475 expose a portion of the first epitaxial layer 462 in which a facet phenomenon does not occur, and an area of the exposed portion of the first epitaxial layer 462 may be varied.

Figure 18:
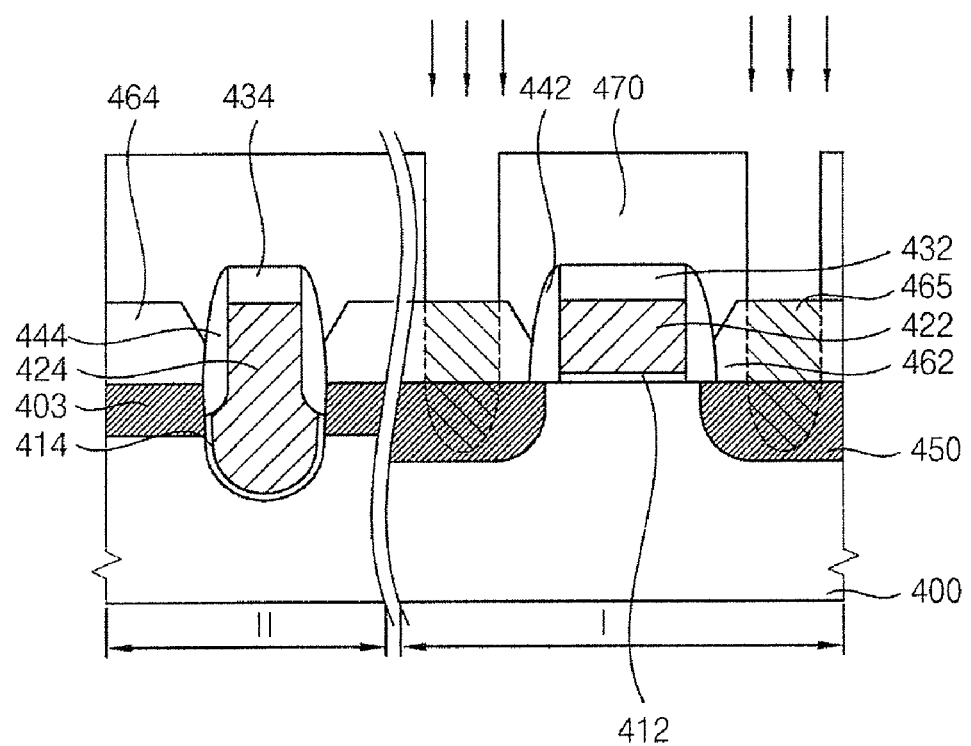

Referring to FIG. 18, an ion implantation process may be performed using the insulating interlayer 470 covering the first and second gate structures as an ion implantation mask, so that third impurities may be implanted into the exposed portion of the first epitaxial layer 462. Thus, the portion of the first epitaxial layer 462 in which the third impurities are doped serves as a first ESD layer 465. The third impurities may be also implanted into an upper portion of the peripheral region I of the substrate 400. Thus, the impurity region 450, in which the second impurities and/or the third impurities are doped, together with the first ESD layer 465, in which the third impurities are doped, serves as a source/drain region of a transistor on the peripheral region I.

A second opening (not shown) may be formed through the insulating interlayer 470 to partially expose the second epitaxial layer 464, and fourth impurities may be implanted into the second epitaxial layer 464 to form a second ESD layer (not shown). The fourth impurities may be also implanted into a portion of the preliminary source/drain region 403, and the second ESD layer and the preliminary source/drain region 403 may serve as a source/drain region of a transistor on the cell region II.

By the above processes, a semiconductor device in accordance with the example embodiments may be formed.

Figure 19:
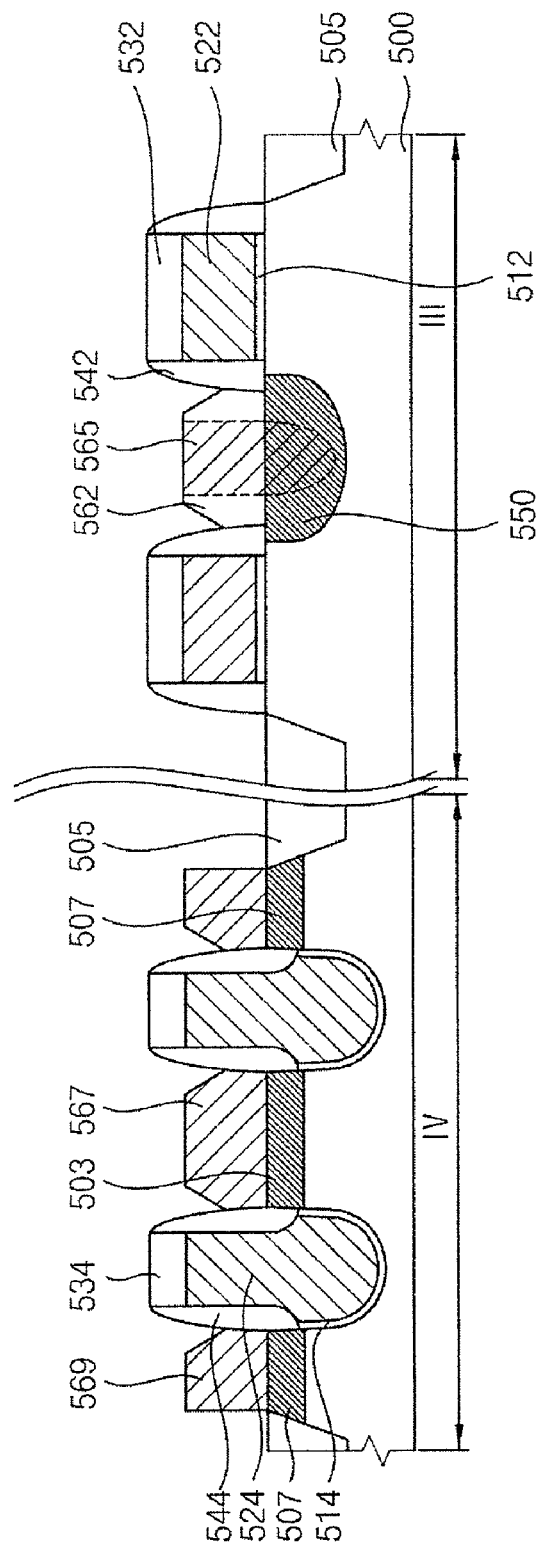
FIG. 19 is a cross-sectional view illustrating a semiconductor device in accordance with example embodiments.

FIG. 19 is a cross-sectional view illustrating a semiconductor device in accordance with example embodiments. The semiconductor device of FIG. 19 is substantially the same or similar to that illustrated with reference to FIGS. 9 to 18. However, in FIG. 19, two gate structures are formed in each of a peripheral region III and a cell region IV, respectively.

Referring to FIG. 19, the semiconductor device is formed on an active region of a substrate 500. The active region is defined by an isolation layer 505. The substrate 500 includes the peripheral region III and the cell region IV.

The semiconductor device includes two first gate structures on the peripheral region III and a first source/drain region between the two first gate structures. Each of the first gate structures includes a first gate insulation layer pattern 512, a first gate electrode 522, a first gate mask 532 and a first spacer 542. The source/drain region includes a first impurity region 550 at an upper portion of the substrate 500 adjacent to the first gate structures, and a first ESD layer 565 at a portion of a first epitaxial layer 562 on the first impurity region 550.

The semiconductor device includes two second gate structures in the cell region IV and second and third source/drain regions adjacent to the second gate structures. Each of the second gate structures includes a second gate insulation layer pattern 514, a second gate electrode 524, a second gate mask 534 and a second spacer 544. The second source/drain region includes a second impurity region 503 at an upper portion of the substrate 500 between the second gate structures, and a second ESD layer 567 at a portion of a second epitaxial layer on the second impurity region 503. The third source/drain region includes a third impurity region 507 at an upper portion of the substrate 500 adjacent to the second gate structures, and a third ESD layer 569 at a portion of a third epitaxial layer on the third impurity region 507.

The scope of the inventive concept is not limited to the above semiconductor device, and may include other semiconductor devices having a plurality of gate structures and source/drain regions adjacent to the gate structures.

Figure 20:
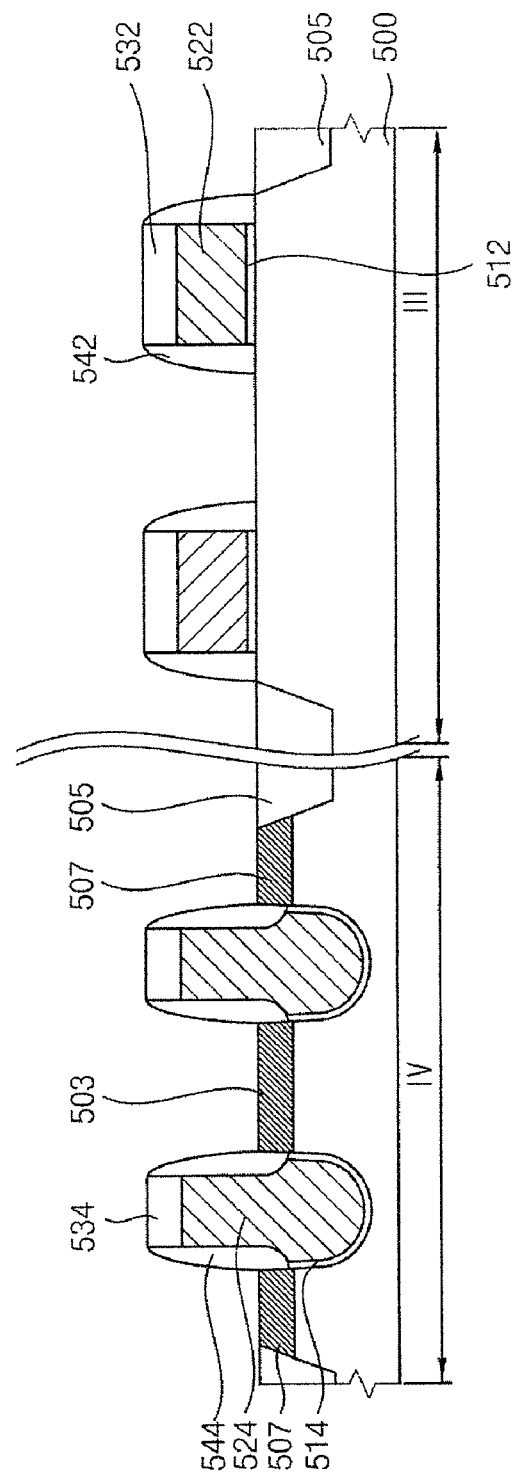
FIGS. 20 to 26 are cross-sectional views illustrating a method of manufacturing a semiconductor device in accordance with example embodiments.
Figure 21:
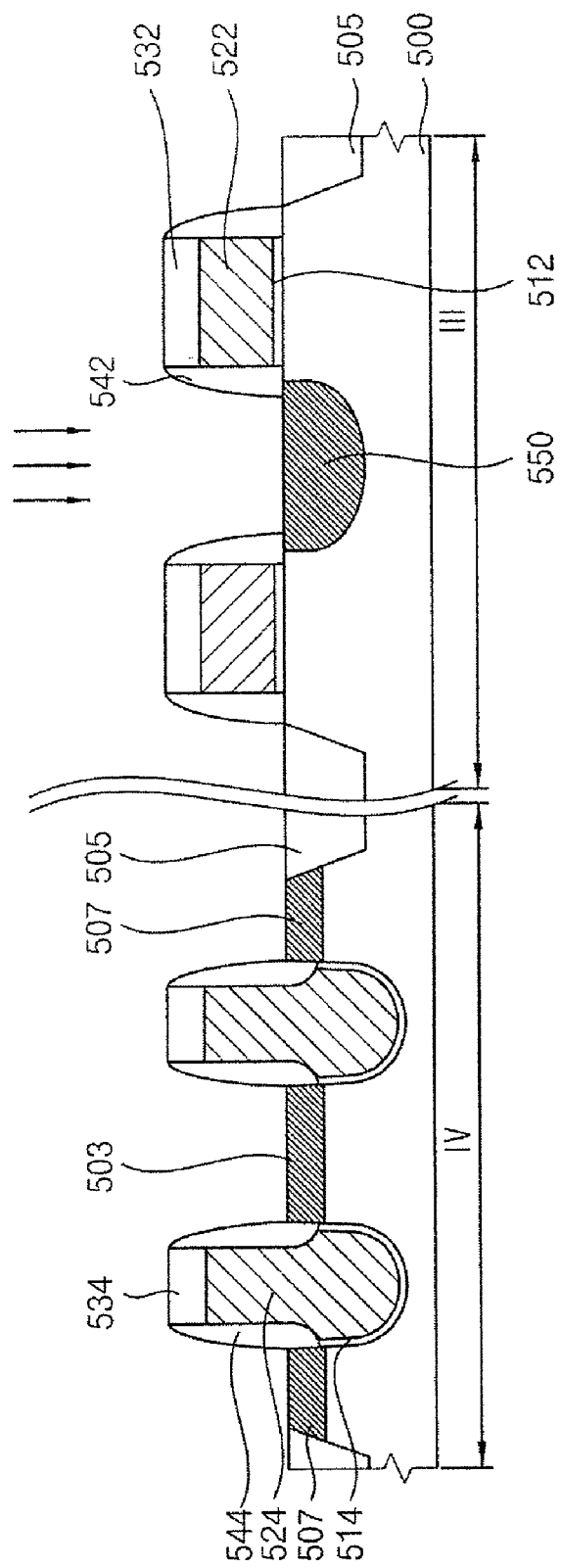
Figure 22:
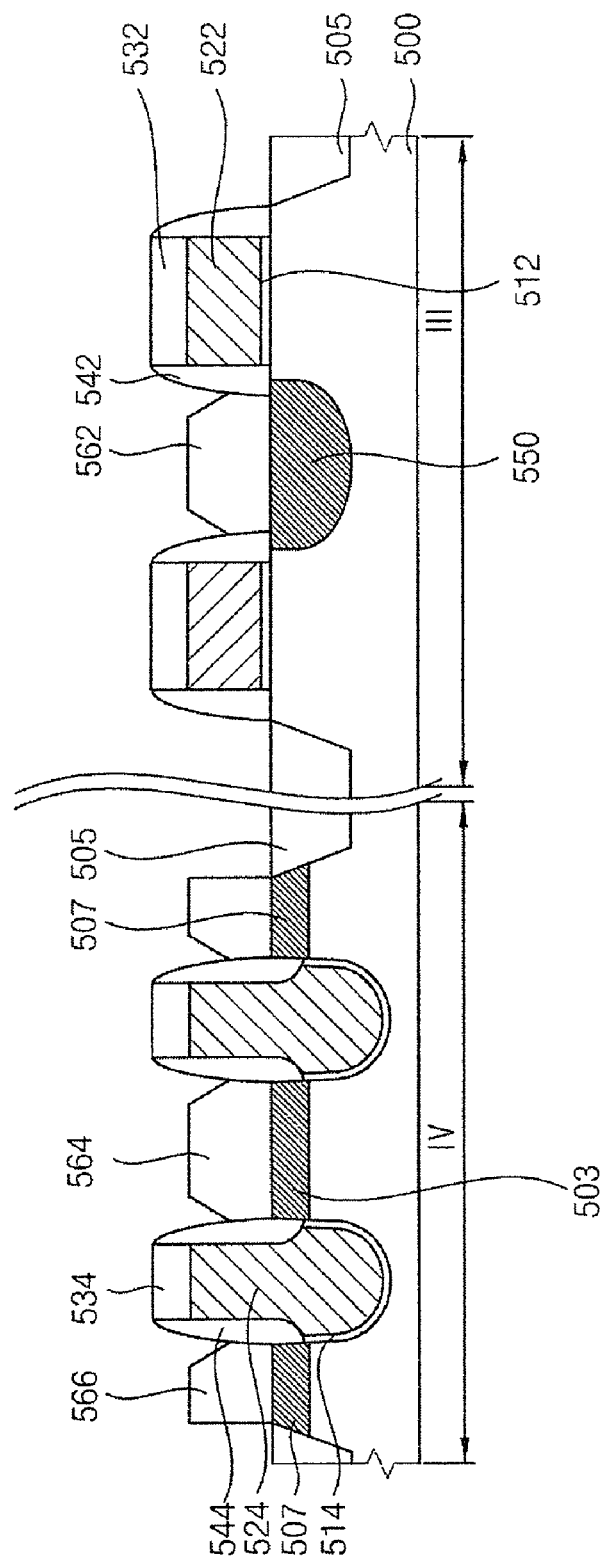
Figure 23:
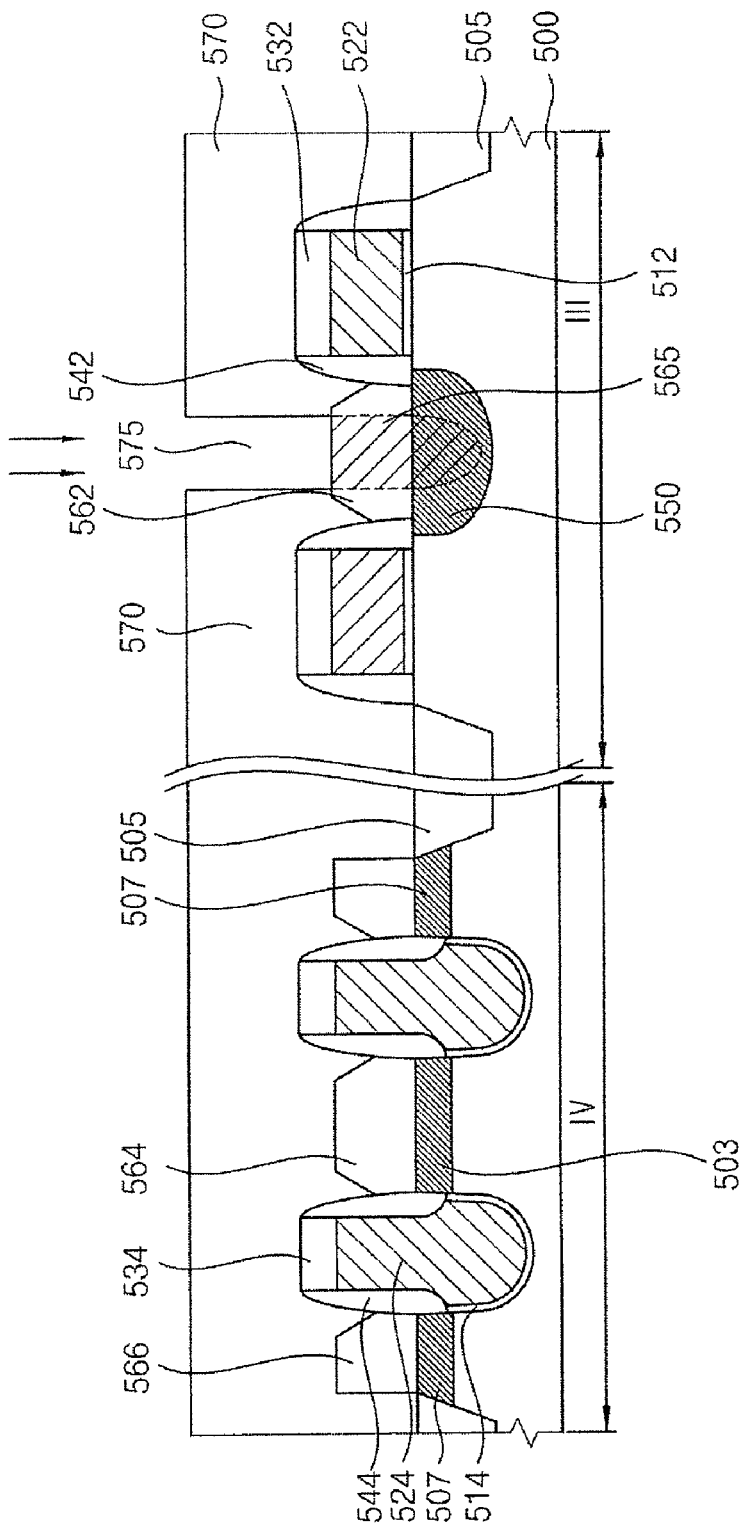

FIGS. 20 to 26 are cross-sectional views illustrating a method of manufacturing a semiconductor device in accordance with example embodiments. FIGS. 20 to 26 show a dynamic random access memory (DRAM), however, the scope of the inventive concept is not limited thereto. Processes illustrated with reference to FIGS. 21 to 23 are substantially the same or similar to those of FIGS. 15 to 18.

Referring to FIG. 20, a first gate structure and a second gate structure are formed on a substrate 500 including an active region and a field region, which is defined by an isolation layer 505. Particularly, the first gate structure is formed in a peripheral region III, and the second gate structure is formed in a cell region IV.

The first gate structure includes a first gate insulation layer pattern 512, a first gate electrode 522, a first gate mask 532 and a first spacer 542. A plurality of the first gate structures are formed, and in the present embodiment, two first gate structures are formed.

The second gate structure includes a second gate insulation layer pattern 514, a second gate electrode 524, a second gate mask 534 and a second gate spacer 544. In an example embodiment, the second gate structure is a recess gate structure filling a trench on the cell region IV of the substrate 500.

A plurality of the second gate structures are formed, and in the present embodiment, two second gate structures are formed. A second impurity region 503 and a third impurity region 507 in which second impurities are doped are formed at upper portions of the substrate 500 adjacent to the second gate structures.

Referring to FIG. 21, an ion implantation process using an ion mask (not shown) may be performed on the substrate 500, thereby implanting first impurities into an upper portion of the substrate 500 between the first gate structures in the peripheral region III to form a first impurity region 550.

Referring to FIG. 22, after removing the ion mask, an SEG process may be performed on the substrate 500 to form a first epitaxial layer 562 in the peripheral region III and second and third epitaxial layers 564 and 566 in the cell region IV.

Referring to FIG. 23, a first insulating interlayer 570 is formed on the substrate 500 to cover the first and second gate structures and the first to third epitaxial layers 562, 564 and 566. A first opening 575 is formed through the first insulating interlayer 570 to partially expose the first epitaxial layer 562. An ion implantation process using the first insulating interlayer 570 as an ion mask may be performed on the substrate 500, thereby implanting third impurities into the exposed portion of the first epitaxial layer 562. Thus, the portion of the first epitaxial layer 562 in which the third impurities are doped is converted into a first ESD layer 565. The third impurities may be also implanted into an upper portion of the peripheral region III of the substrate 500. Thus, the first impurity region 550 doped with the first and/or the third impurities, together with the first ESD layer 565 doped with the third impurities, serves as a source/drain region of a transistor in the peripheral region III.

Figure 24:
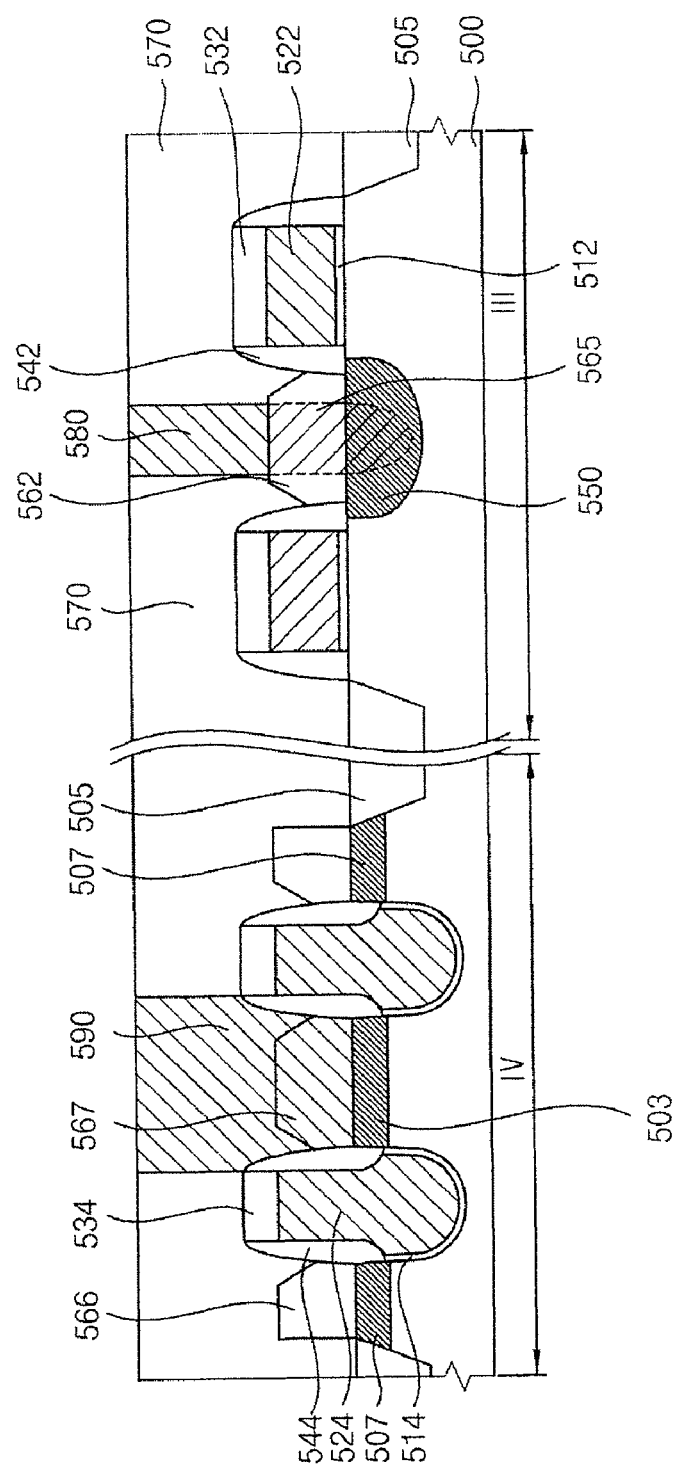

Referring to FIG. 24, a first plug 580 is formed on the first epitaxial layer 562 to fill the first opening 575. Particularly, a first conductive layer may be formed on the first insulating interlayer 570 to fill the first opening 575, and an upper portion of the first conductive layer may be removed until the first insulating interlayer 570 is exposed, thereby forming the first plug 580. The upper portion of the first conductive layer may be removed by a chemical mechanical polishing (CMP) process and/or an etch back process. The first conductive layer may be formed using a metal, a metal nitride, a metal silicide, etc.

After forming a second opening (not shown) exposing the second epitaxial layer 564 through the first insulating interlayer 570, a second plug 590 is formed on the second epitaxial layer 564 to fill a second opening formed in the first insulating interlayer 570. In an example embodiment, the second opening may expose not only the second epitaxial layer 564 but also the second spacers 544, and thus the second plug 590 may be self-aligned with the second gate structures. The second plug 590 may be formed by the following processes. A second conductive layer may be formed on the first insulating interlayer 570 to fill the second opening, and an upper portion of the second conductive layer may be removed until the first insulating interlayer 570 may be exposed. The second conductive layer may be formed using doped polysilicon, a metal, a metal nitride, a metal silicide, etc. In the present embodiment, the second conductive layer may be formed using polysilicon doped with fourth impurities, and the fourth impurities may be also doped into the second epitaxial layer 564. Thus, the second epitaxial layer 564 is converted into a second ESD layer 567. The second ESD layer 567 and the second impurity region 503 serve as a source/drain region of a transistor in the cell region IV.

A bit line (not shown) may be formed on the first insulating interlayer 570 to be electrically connected to the second plug 590. Particularly, a third conductive layer may be formed on the first insulating interlayer 570, and the third conductive layer may be patterned to form the bit line. The third conductive layer may be formed using a metal, a metal nitride, a metal silicide, doped polysilicon, etc. The bit line may be formed to also be electrically connected to the first plug 580.

Figure 25:
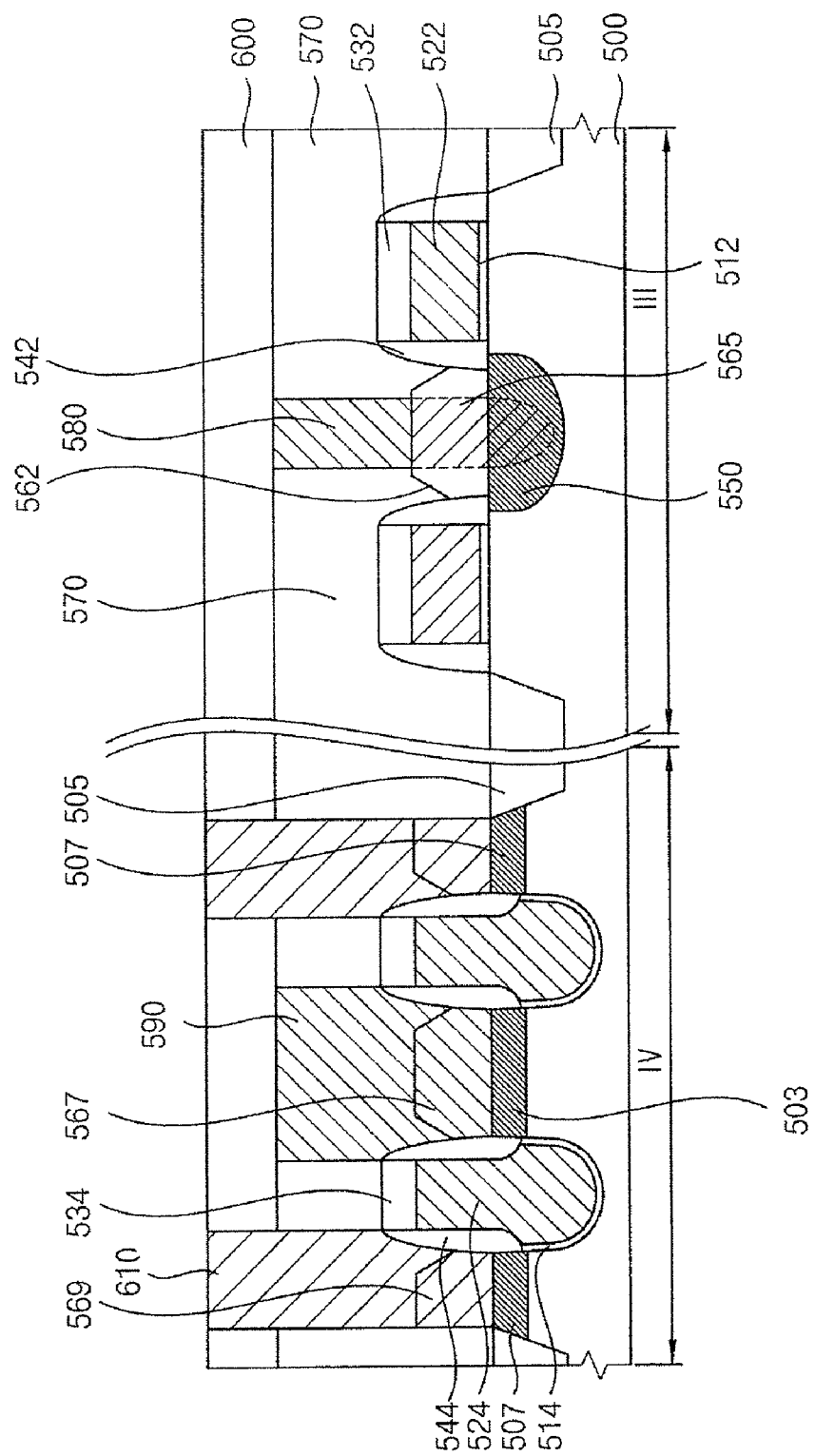

Referring to FIG. 25, a second insulating interlayer 600 is formed on the first insulating interlayer 570, and the first and second plugs 580 and 590 to cover the bit line. The second insulating interlayer 600 may be formed using an oxide such as silicon oxide.

After forming a third opening (not shown) exposing the third epitaxial layer 564 through the first and second insulating interlayers 570 and 600, a third plug 610 is formed to fill the third opening. In an example embodiment, the third opening exposes not only the third epitaxial layer 564 but also the second spacers 544. The third plug 610 may be formed by the following processes. A fourth conductive layer may be formed on the second insulating interlayer 600 to fill the third opening, and an upper portion of the fourth conductive layer may be removed until the second insulating interlayer is exposed. The fourth conductive layer may be formed using doped polysilicon, a metal, a metal nitride, a metal silicide, etc. In the present embodiment, the fourth conductive layer is formed using polysilicon doped with the fourth impurities, and the fourth impurities may be also doped into the third epitaxial layer 566. Thus, the third epitaxial layer 566 is converted into a third ESD layer 569. The third ESD layer 569 and the second impurity region 507 serve as a source/drain region of a transistor on the cell region IV.

Figure 26:
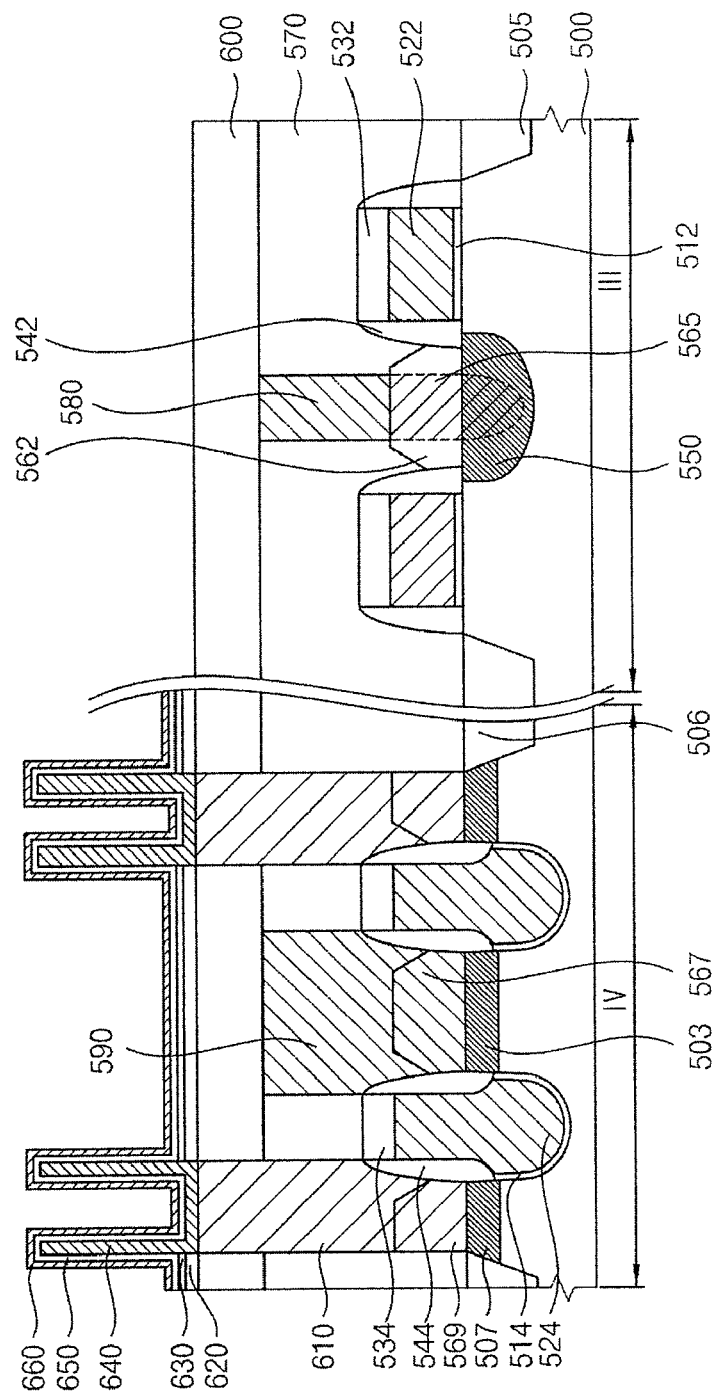

Referring to FIG. 26, a third insulating interlayer 620 and an etch stop layer 630 are formed on the second insulating interlayer 600. The third insulating interlayer 620 may be formed using an oxide such as silicon oxide, and the etch stop layer 630 may be formed using a material having an etching selectivity with respect to the third insulating interlayer 620, e.g., silicon nitride.

A mold layer (not shown) may be formed on the etching stop layer 630, and a hole (not shown) may be formed through the mold layer by a first etching process. A second etching process may be performed to enlarge the hole, and the etch stop layer 630 and the third insulating interlayer 620 may be removed until the third plug 610 is exposed.

After forming a fifth conductive layer on an inner wall of the hole and the mold layer, an upper portion of the fifth conductive layer may be removed to form a lower electrode 640 on the inner wall of the hole. The fifth conductive layer may be formed using doped polysilicon, a metal, etc. After removing the mold layer, a dielectric layer 650 and an upper electrode 660 are sequentially formed on the lower electrode 640 and the etch stop layer 630, thereby forming a capacitor electrically connected to the third plug 610. The dielectric layer 650 may be formed using a high-k material such as hafnium oxide, and the upper electrode may be formed using doped polysilicon, a metal, etc.

Metal wirings (not shown) may be further formed to be electrically connected to the bit line or the first plug in the peripheral region III.

By performing the above processes, the semiconductor device may be manufactured.

Figure 27:
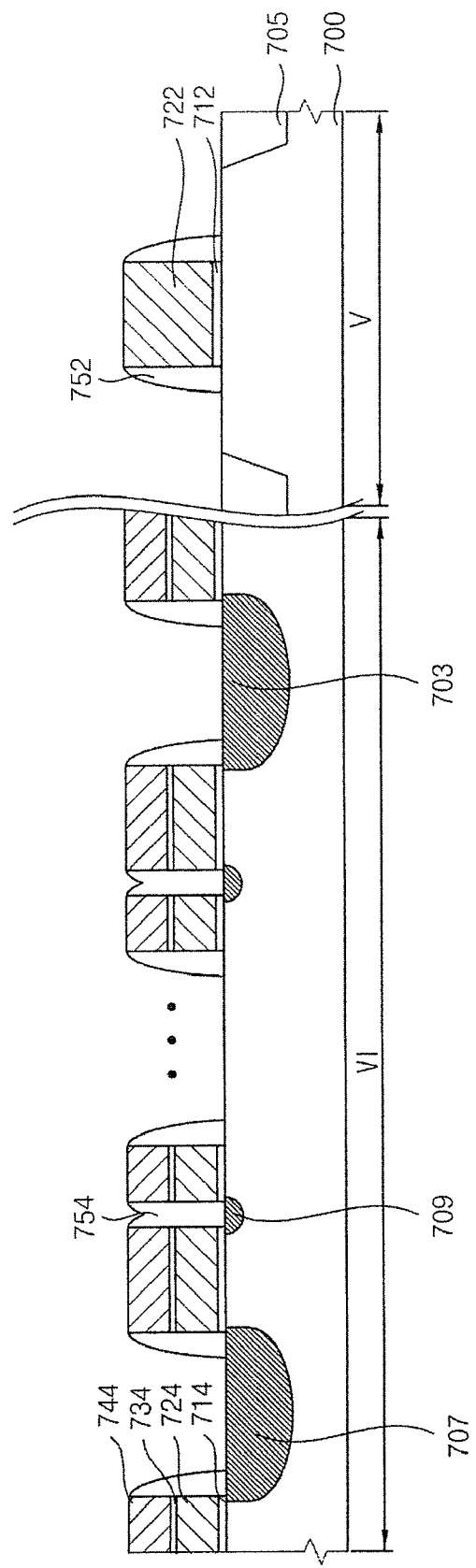
FIGS. 27 to 33 are cross-sectional views illustrating a method of manufacturing a semiconductor device in accordance with example embodiments.
Figure 28:
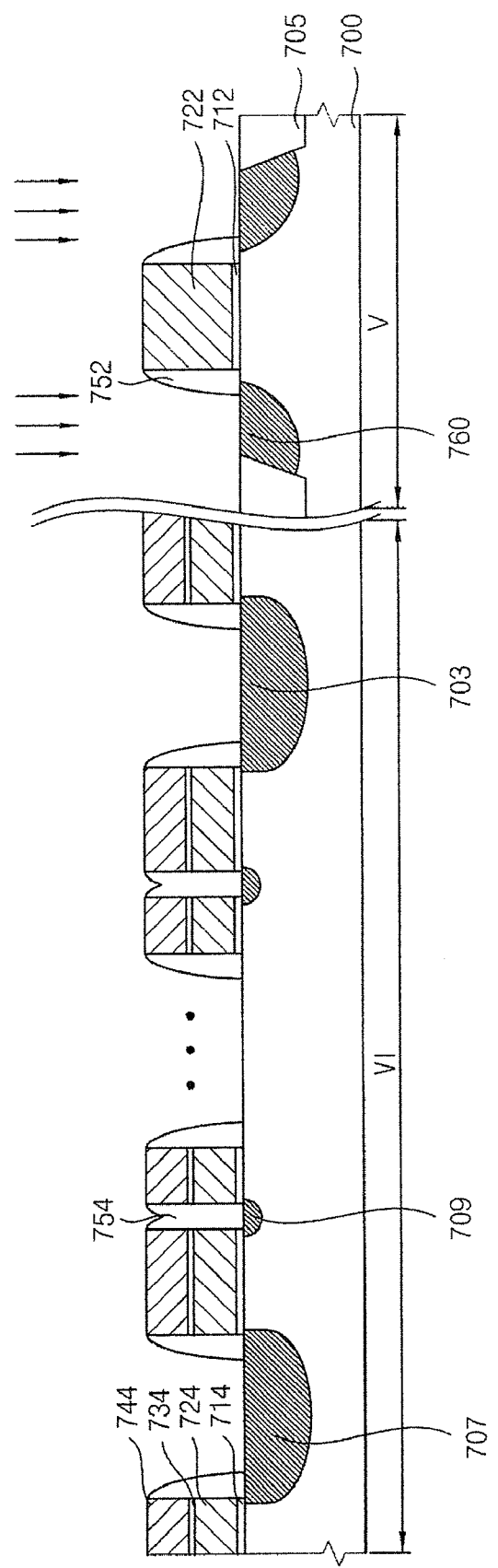
Figure 29:
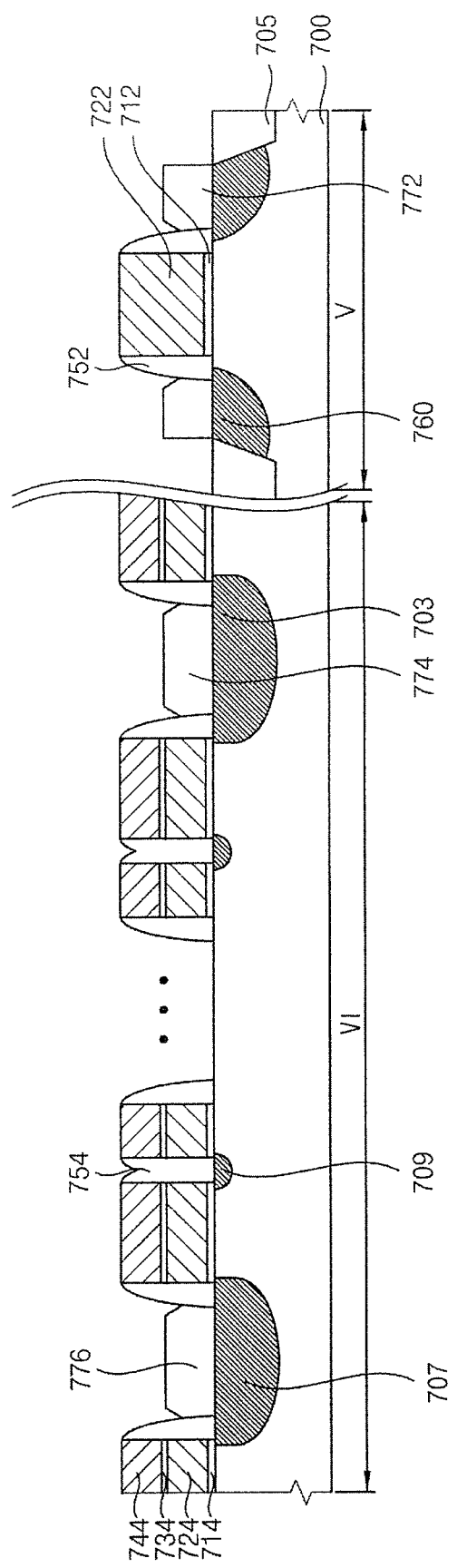
Figure 30:
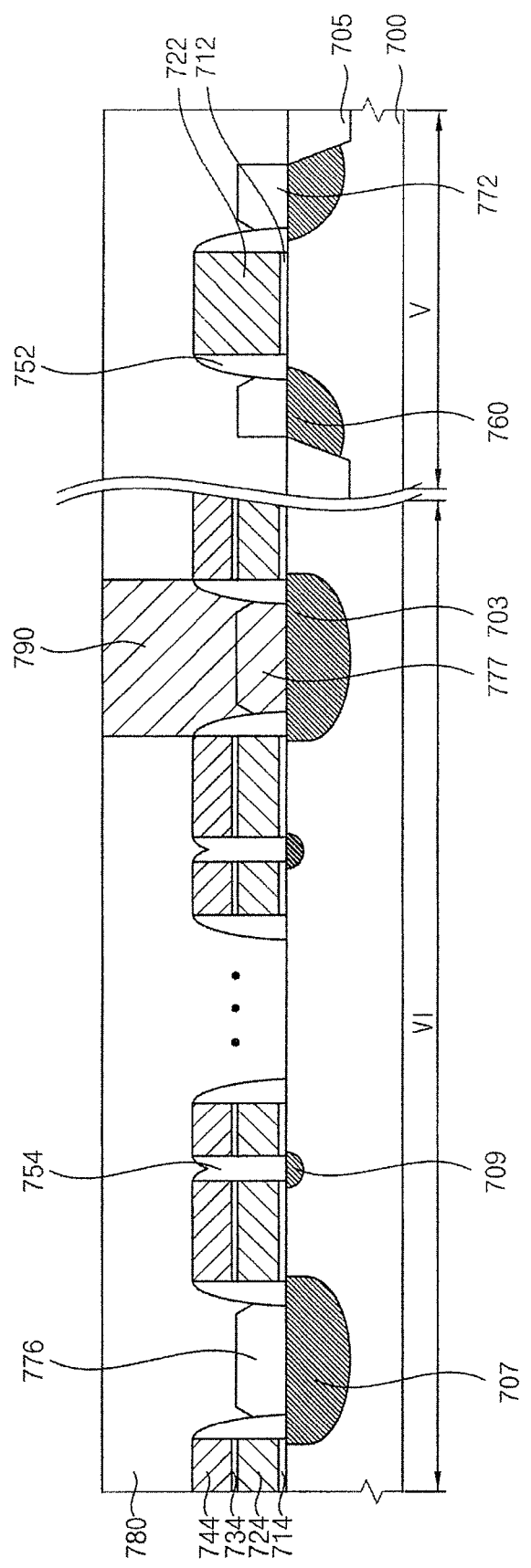
Figure 31:
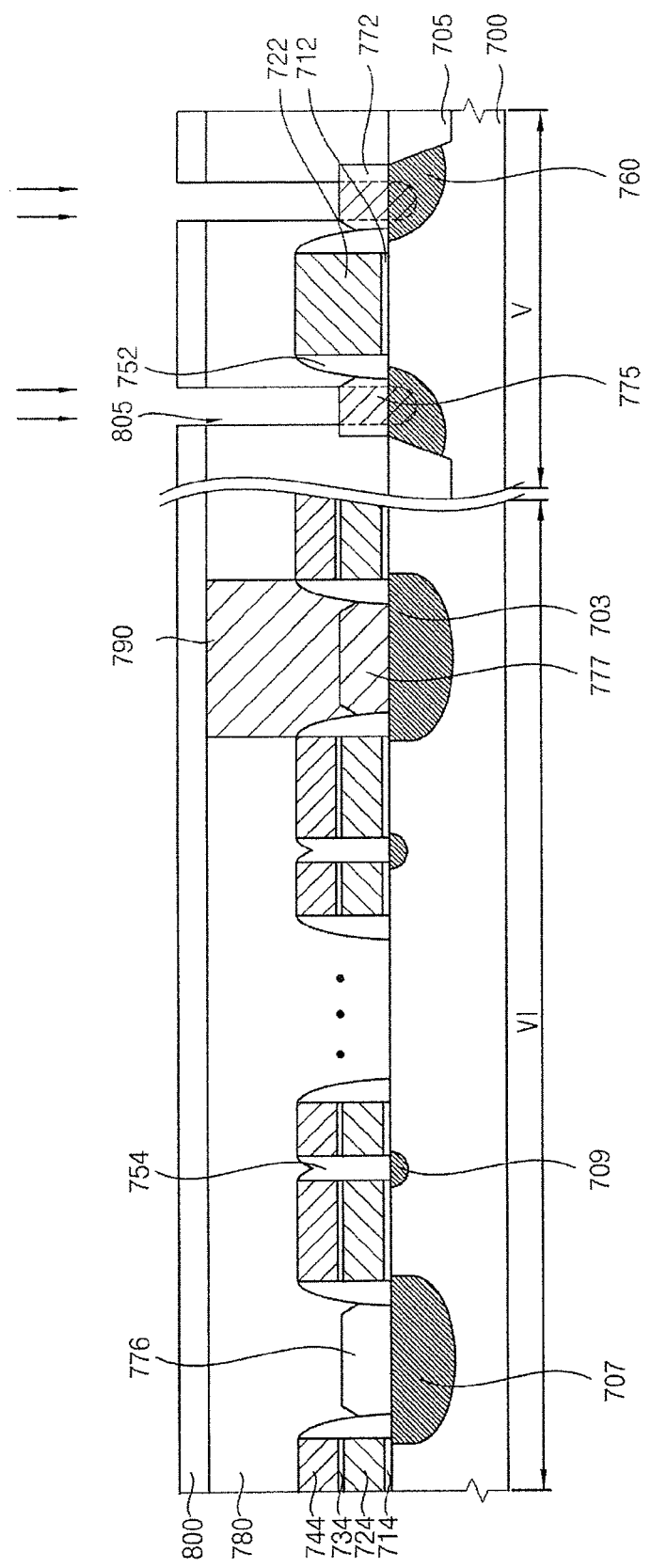

FIGS. 27 to 33 are cross-sectional views illustrating a method of manufacturing a semiconductor device in accordance with example embodiments. FIGS. 27 to 33 show a NAND flash memory device, however, the scope of the inventive concept is not limited thereto. Processes illustrated with reference to FIGS. 28, 29 and 31 are substantially the same or similar to those of FIGS. 15 to 18.

Referring to FIG. 27, a substrate 700 including an active region and a field region, which are defined by an isolation layer 705, is provided. The substrate 700 includes a peripheral region V and a cell region VI. A first gate structure is formed on the peripheral region V, and a plurality of second gate structures are formed on the cell region VI.

The first gate structure includes a gate insulation layer pattern 712, a gate electrode 722 and a first spacer 752. The gate insulation layer pattern 712 may be formed using an oxide such as silicon oxide, or an oxynitride such as silicon oxynitride. The gate electrode 722 may be formed using doped polysilicon, a metal, a metal nitride and/or a metal silicide. The first spacer 752 may be formed using a nitride such as silicon nitride.

In an example embodiment, each of the second gate structures includes a tunnel insulation layer pattern 714, a floating gate 724, a dielectric layer pattern 734, a control gate 744 and a second spacer 754. The tunnel insulation layer pattern 714 may be formed using an oxide such as silicon oxide, an oxynitride such as silicon oxynitride, silicon oxide doped with impurities, or a low-k material. The floating gate 724 may be formed using doped polysilicon or a metal having a high work function such as tungsten, titanium, cobalt, nickel, etc. The dielectric layer pattern 734 may be formed to have an oxide/nitride/oxide (ONO) structure. Alternatively, the dielectric layer pattern 734 may be formed using a metal oxide having a high dielectric constant, thereby having a high capacitance and a low leakage current. The control gate 744 may be formed using doped polysilicon, a metal, a metal nitride and/or a metal silicide.

In another example embodiment, each of the second gate structures includes a tunnel insulation layer pattern 714, a charge storing layer pattern 724, a blocking layer pattern 734, a gate electrode 744 and a first spacer 754. The charge storing layer pattern 724 may be formed using a nitride such as silicon nitride, or a hafnium oxide such as hafnium silicon oxide. The blocking layer pattern 734 may be formed using an oxide such as silicon oxide or a metal oxide having a high dielectric constant. The gate electrode 744 may be formed using doped polysilicon, a metal, a metal nitride and/or a metal silicide.

A plurality of strings, each of which may include a plurality of second gate structures may be formed in the cell region VI. Each string may include a plurality of cell gate structures, a ground selection line (GSL), and a string selection line (SSL). If the GSL is formed at one side of the cell gate structure, the SSL may be formed at the other side of the cell gate structure. A second impurity region 703 and a third impurity region 707 are formed at upper portions of the substrate 700 between the strings, and a fourth impurity region 709 is formed at an upper portion of the substrate 700 between the second gate structures in each string. The second to fourth impurity regions 703, 707 and 709 are doped with second impurities.

Referring to FIG. 28, an ion implantation process using an ion mask may be performed on the substrate 700, so that a first impurity region 760 doped with first impurities is formed at an upper portion of the peripheral region V of the substrate 700 adjacent to the first gate structure.

Referring to FIG. 29, after removing the ion mask, an SEG process may be performed on the substrate 700 to form a first epitaxial layer 772 in the peripheral region V and second and third epitaxial layers 774 and 776 in the cell region VI. Alternatively, the second and third epitaxial layers 774 and 776 may not be formed.

Referring to FIG. 30, a first insulating interlayer 780 is formed on the substrate 700 to cover the first and second gate structures and the first to third epitaxial layers 772, 774 and 776. A common source line (CSL) 790 is formed through the first insulating interlayer 780 to contact the second epitaxial layer 774. The CSL 790 may be formed to be self-aligned with the second gate structures. In an example embodiment, the CSL 790 is formed using polysilicon doped with third impurities, and the third impurities may be also doped into the second epitaxial layer 774. Thus, the second epitaxial layer 774 is converted into a second ESD layer 777. When the second epitaxial layer 774 is not formed, the CSL 790 may be formed directly on the second impurity region 703 using doped polysilicon, a metal, a metal nitride and/or a metal silicide.

Referring to FIG. 31, a second insulating interlayer 800 is formed on the first insulating interlayer 780 and the CSL 790, and openings 805 are formed through the first and second insulating interlayers 780 and 800 to partially expose the first epitaxial layer 772. An ion implantation process may be performed to implant fourth impurities into the exposed portion of the first epitaxial layer 772. Thus, the portion of the first epitaxial layer doped with the fourth impurities is converted into a first ESD layer 775. The fourth impurities may be also implanted into an upper portion of the peripheral region V of the substrate 700. Thus, the first impurity region 760 and the first ESD layer 775 serve as a source/drain region of a transistor in the peripheral region V.

Figure 32:
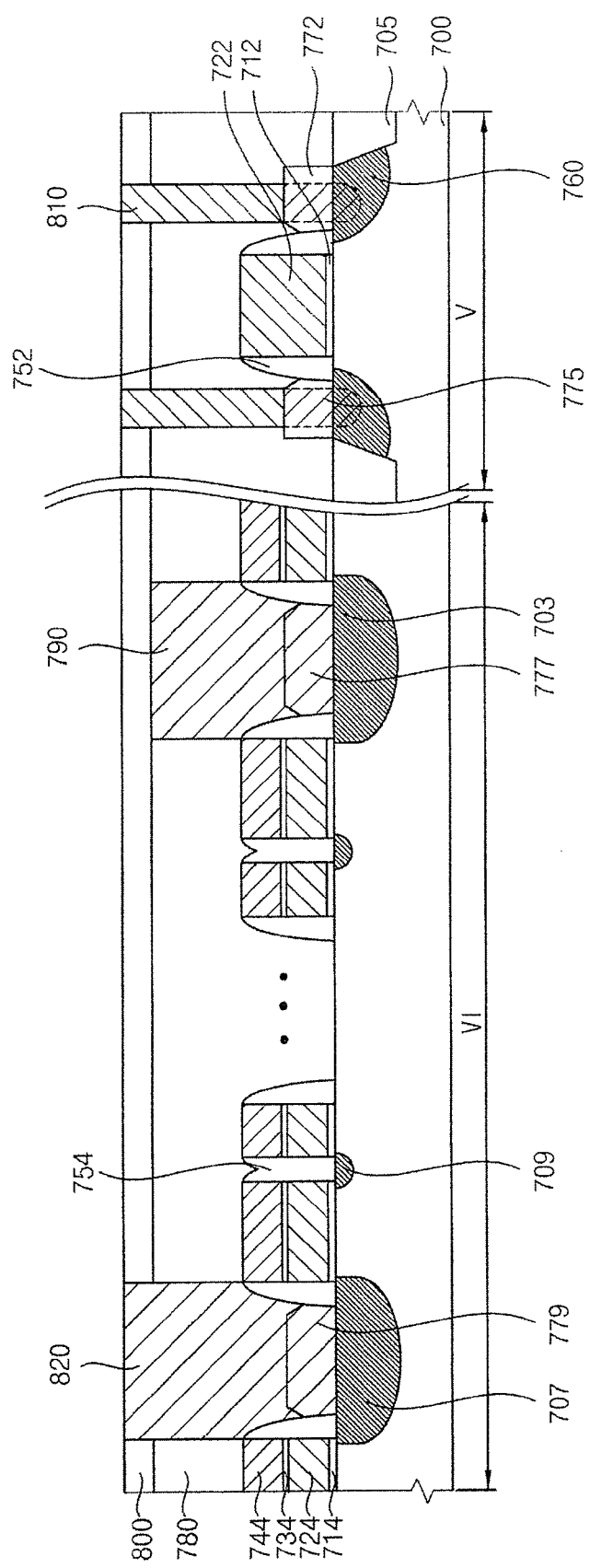

Referring to FIG. 32, first plugs 810 are formed on the first ESD layer 775 to fill the openings 805. The first plugs 810 may be formed using a metal, a metal nitride, a metal silicide, etc.

A second plug 820 is formed on the third epitaxial layer 776. The second plug 820 may be formed to be self-aligned with the second gate structures. In an example embodiment, the second plug 820 may be formed using polysilicon doped with the third impurities, and the third impurities may be also doped into the third epitaxial layer 776. Thus, the third epitaxial layer 776 is converted into a third ESD layer 779. When the third epitaxial layer 776 is not formed, the second plug 820 may be directly formed on the third impurity region 707 using doped polysilicon, a metal, a metal nitride and/or a metal silicide.

Figure 33:
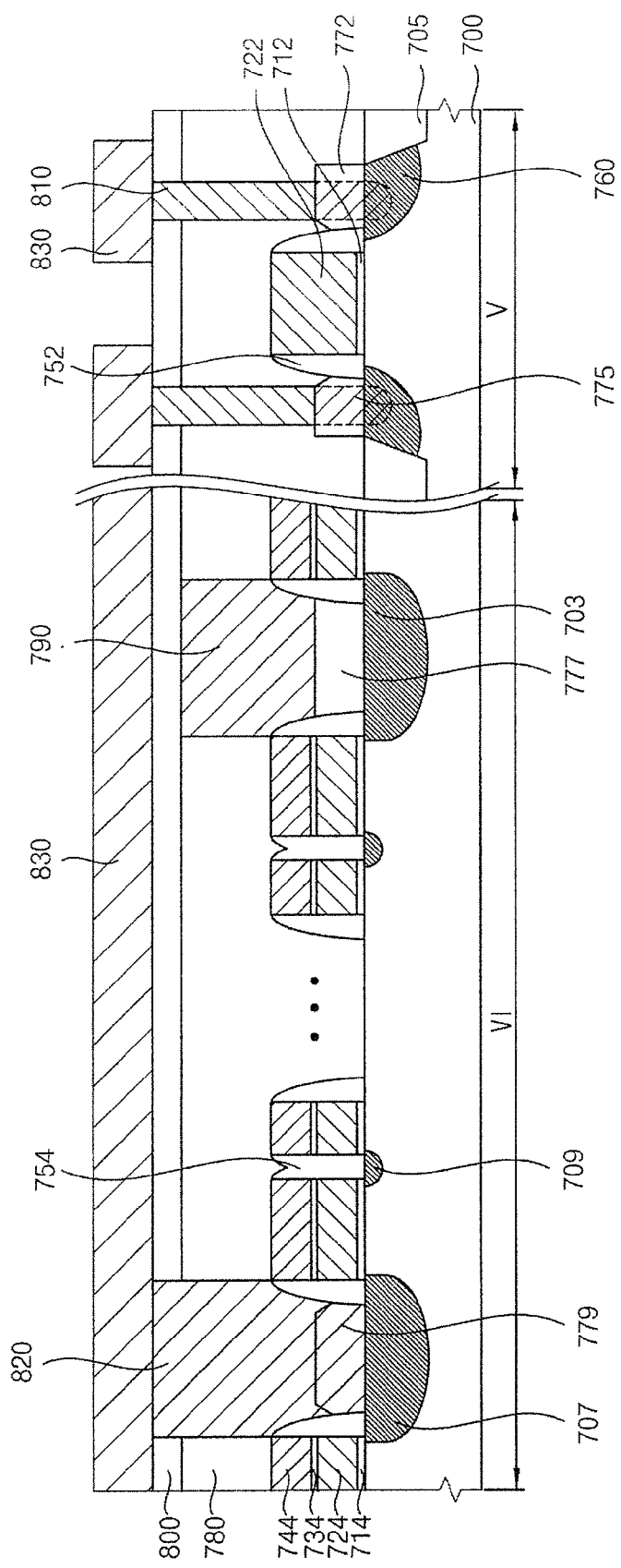

Referring to FIG. 33, a bit line 830 is formed on the second insulating interlayer 800 to be electrically connected to the second plug 820. The bit line 830 may be formed using a metal, a metal nitride, a metal silicide, doped polysilicon, etc. The bit line 830 may be formed to also be electrically connected to the first plug 810.

Metal wirings (not shown) may be further formed to be electrically connected to either the bit line 830 or the first plug 810 in the peripheral region V.

By performing the above processes, the semiconductor device may be manufactured.

According to example embodiments, before fanning an epitaxial layer, an impurity region may be formed at a portion of a substrate by implanting impurities. Additionally, after forming the epitaxial layer, impurities may be implanted into the substrate only through a portion of the epitaxial layer at which no facet phenomenon occurs, thereby forming an ESD layer. Thus, a doping profile of the impurity region may be uniform because the facet does not affect the doping profile. Furthermore, when the epitaxial layer is not uniform, the impurity region may have a uniform doping profile by reducing an area through which the impurities are implanted.

Accordingly, the transistor or the semiconductor device in accordance with example embodiments may have a uniform doping profile and more uniform characteristics regardless of the shape or the thickness of the epitaxial layer.

The foregoing is illustrative of example embodiments and is not to be construed as limiting thereof. Although some example embodiments have been described, those skilled in the art will readily appreciate that many modifications are possible without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a transistor, comprising:
   forming a gate structure on a substrate;
   forming a spacer layer on sidewalls of the gate structure;
   implanting first impurities into the substrate to form an impurity region at an upper portion of the substrate adjacent to the gate structure;
   forming an epitaxial layer against the spacer layer on the impurity region;
   forming an insulation layer having an opening on the substrate, wherein the opening partially exposes the epitaxial layer without overlapping the spacer layer; and
   implanting second impurities into a portion of the epitaxial layer exposed by the opening.

2. The method of claim 1, wherein some of the second impurities are diffused into the impurity region.

3. The method of claim 1, wherein the opening exposes a portion of the epitaxial layer having a surface substantially parallel to an upper surface of the substrate.

4. The method of claim 1, wherein a height of the epitaxial layer is substantially the same as a height of a gate electrode of the gate structure.

5. A method of manufacturing a semiconductor device, comprising:
   forming a first gate structure and a second gate structure in a peripheral region and a cell region of a substrate, respectively;
   implanting first impurities into the substrate to form an impurity region at an upper portion of the peripheral region of the substrate adjacent to the first gate structure;
   forming a first epitaxial layer on a portion of the peripheral region not covered by the first gate structure and a second epitaxial layer on a portion of the cell region not covered by the second gate structure;
   forming an insulation layer having an opening on the substrate, wherein the opening partially exposes the first epitaxial layer; and
   implanting second impurities into a portion of the first epitaxial layer exposed by the opening, wherein forming the second gate structure includes forming a trench in the cell region, and wherein at least part of the second gate structure is formed in the trench.

6. The method of claim 5, wherein some of the second impurities are diffused into the impurity region.

7. The method of claim 5, wherein the opening exposes a portion of the first epitaxial layer spaced apart from the first gate structure.

8. The method of claim 5, further comprising implanting third impurities into the cell region prior to forming the trench.

9. The method of claim 5, wherein forming the second gate structure comprises:
   forming a gate insulation layer to fill the trench;
   forming a gate conductive layer on the gate insulation layer;
   forming a gate mask layer on the gate conductive layer;
   patterning the gate mask layer, the gate conductive layer and the gate insulation layer to form a gate mask, a gate electrode and a gate insulation layer pattern, respectively; and
   forming a spacer on a sidewall of the gate mask and the gate electrode to fill a remaining unfilled portion of the trench.

* * * * *